(12) United States Patent
Choi et al.

(10) Patent No.: US 12,745,392 B2
(45) Date of Patent: Sep. 22, 2026

(54) METHOD FOR MANUFACTURING SEMICONDUCTOR DEVICE

(71) Applicant: SAMSUNG ELECTRONICS CO., LTD., Suwon-si (KR)

(72) Inventors: Hyunmook Choi, Suwon-si (KR); Jihong Kim, Seoul (KR); Kyoungcho Na, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 1024 days.

(21) Appl. No.: 17/894,524

(22) Filed: Aug. 24, 2022

(65) Prior Publication Data

US 2023/0180475 A1 Jun. 8, 2023

(30) Foreign Application Priority Data

Dec. 6, 2021 (KR) ........................ 10-2021-0173085

(51) Int. Cl.
*H10B 43/27* (2023.01)
*G11C 16/14* (2006.01)
(Continued)

(52) U.S. Cl.
CPC ............. *H10B 43/27* (2023.02); *G11C 16/14* (2013.01); *H10B 41/10* (2023.02); *H10B 41/27* (2023.02);
(Continued)

(58) Field of Classification Search
CPC ...................................................... H10B 43/27
See application file for complete search history.

(56) References Cited

U.S. PATENT DOCUMENTS 11,049,876 B2 6/2021 Kaminaga et al.
2011/0081769 A1* 4/2011 Takemura .......... H10D 86/0214 257/E21.085

(Continued)

FOREIGN PATENT DOCUMENTS

KR 1020160106972 A 9/2016
KR 10-2018-0047048 A 5/2018

(Continued)

*Primary Examiner* — Jeff W Natalini
*Assistant Examiner* — Jacob Raul Marin
(74) *Attorney, Agent, or Firm* — Muir Patent Law, PLLC

(57) ABSTRACT

A method for manufacturing a semiconductor device including forming a first substrate and a second substrate thereon; forming a first stack region by alternately stacking first interlayer insulating and sacrificial layers on the second substrate; forming a second stack region by alternately stacking second interlayer insulating and sacrificial layers on the first stack region; forming first openings spaced apart from each other in the first direction by partially removing the second stack region; forming a first filling insulating layer in the first openings; forming a second opening by partially removing the second stack region between the first openings; removing the second sacrificial layers exposed through the second opening; forming a lower separation region including the first filling insulating layer and a second filling insulating layer, by forming the second filling insulating layer in the second opening and regions in which the second sacrificial layers have been removed.

20 Claims, 39 Drawing Sheets

(51) Int. Cl.

| | |
|---|---|
| ***H10B 41/10*** | (2023.01) |
| ***H10B 41/27*** | (2023.01) |
| ***H10B 41/35*** | (2023.01) |
| ***H10B 43/10*** | (2023.01) |
| ***H10B 43/35*** | (2023.01) |

(52) U.S. Cl.

CPC ............. *H10B 41/35* (2023.02); *H10B 43/10* (2023.02); *H10B 43/35* (2023.02)

(56) References Cited

U.S. PATENT DOCUMENTS

| | | | | |
|---|---|---|---|---|
| 2014/0264525 | A1* | 9/2014 | Takahashi ............ | H10D 30/693 257/314 |
| 2016/0260735 | A1 | 9/2016 | Lee et al. | |
| 2016/0268267 | A1 | 9/2016 | Inuma et al. | |
| 2017/0025423 | A1 | 1/2017 | Terada et al. | |
| 2017/0222010 | A1* | 8/2017 | Weis .................... | H10D 62/393 |
| 2017/0301684 | A1 | 10/2017 | Park et al. | |
| 2019/0244970 | A1 | 8/2019 | Jung et al. | |
| 2019/0312049 | A1 | 10/2019 | Cheon et al. | |
| 2020/0020702 | A1 | 1/2020 | Baek | |
| 2020/0105784 | A1* | 4/2020 | Jang ...................... | H01L 21/768 |
| 2020/0273877 | A1 | 8/2020 | Yun et al. | |
| 2021/0082865 | A1* | 3/2021 | Baraskar ................ | H10B 43/40 |
| 2021/0249434 | A1* | 8/2021 | Nishikawa ............. | H10B 43/35 |
| 2021/0257379 | A1* | 8/2021 | Cui ...................... | H10D 30/693 |
| 2021/0257386 | A1* | 8/2021 | Wang ..................... | H10B 41/10 |
| 2021/0327895 | A1 | 10/2021 | Jung | |

FOREIGN PATENT DOCUMENTS

| | | | |
|---|---|---|---|
| KR | 1020190095812 | A | 8/2019 |
| KR | 10-2019-0117954 | A | 10/2019 |
| KR | 1020200104669 | A | 9/2020 |
| KR | 1020210083427 | A | 7/2021 |
| KR | 1020210129366 | A | 10/2021 |

* cited by examiner

GC
ML2
OP1
OP2
OP1
Y
Z
X

METHOD FOR MANUFACTURING SEMICONDUCTOR DEVICE

CROSS-REFERENCE TO RELATED APPLICATION

This application claims benefit of priority to Korean Patent Application No. 10-2021-0173085 filed on Dec. 6, 2021, in the Korean Intellectual Property Office, the disclosure of which is incorporated herein by reference in its entirety.

BACKGROUND

1. Field

Embodiments relate to a semiconductor device and a data storage system including the same.

2. Description of the Related Art

In a data storage system for data storage, a semiconductor device capable of storing high-capacity data may be required. Accordingly, a method for increasing data storage capacity of a semiconductor device has been considered.

SUMMARY

The embodiments may be realized by providing a method for manufacturing a semiconductor device, the method including preparing a first semiconductor structure by forming circuit devices on a first substrate; forming a second substrate, constituting a second semiconductor structure, on the first semiconductor structure; forming a first stack region of a stack structure by alternately stacking first interlayer insulating layers and first sacrificial layers, extending in a first direction, on an upper surface of the second substrate; forming a second stack region of the stack structure by alternately stacking second interlayer insulating layers and second sacrificial layers, extending in the first direction, on the first stack region; forming first openings spaced apart from each other in the first direction by partially removing the second stack region; forming a first filling insulating layer filling the first openings; forming a second opening by partially removing the second stack region between the first openings in the first direction; removing the second sacrificial layers exposed through the second opening; forming a lower separation region including the first filling insulating layer and a second filling insulating layer, by forming the second filling insulating layer filling the second opening and regions in which the second sacrificial layers have been removed; forming a third stack region of the stack structure by alternately stacking third interlayer insulating layers and third sacrificial layers, extending in the first direction, on the first and second filling insulating layers; forming channel structures passing through the stack structure; forming third openings passing through the stack structure, extending in the first direction, and exposing a portion of the first and second filling insulating layers of the lower separation region; removing the first to third sacrificial layers exposed through the third openings; and forming first to third gate electrodes by respectively filling a conductive material in regions in which the first to third sacrificial layers have been removed.

The embodiments may be realized by providing a method for manufacturing a semiconductor device, the method including forming a lower stack region of a stack structure by alternately stacking lower interlayer insulating layers and lower sacrificial layers, extending in a first direction, on an upper surface of a substrate; forming first openings spaced apart from each other in the first direction by partially removing the lower stack region; forming a first filling insulating layer filling the first openings; forming a second opening by partially removing the lower stack region between the first openings; removing portions of the lower sacrificial layers exposed through the second opening; forming a second filling insulating layer filling the second opening and regions in which the lower sacrificial layers have been removed; forming an upper stack region of the stack structure by alternately stacking upper interlayer insulating layers and upper sacrificial layers, extending in the first direction, on the first filling insulating layer and the second filling insulating layer; forming third openings passing through the stack structure, extending in the first direction, and exposing a portion of the first filling insulating layer and the second filling insulating layer; removing the upper sacrificial layers and the lower sacrificial layers through the third openings; and forming gate electrodes by filling a conductive material in regions from which the upper sacrificial layers and the lower sacrificial layers have been removed, wherein the third openings are spaced apart from each other in the first direction, and the first filling insulating layer and the second filling insulating layer remain between the third openings.

The embodiments may be realized by providing a method for manufacturing a semiconductor device, the method including forming a stack structure by alternately stacking interlayer insulating layers and sacrificial layers on an upper surface of a substrate; forming first openings spaced apart from each other in a first direction by partially removing the stack structure at an upper surface of the stack structure to pass through at least one sacrificial layer among the sacrificial layers; forming a first filling insulating layer filling the first openings; forming a second opening by partially removing the stack structure at the upper surface of the stack structure between the first openings such that the second opening passes through the at least one sacrificial layer; removing the at least one sacrificial layer exposed through the second opening; and forming a second filling insulating layer in the second opening and a region in which the at least one sacrificial layer has been removed, wherein the at least one sacrificial layer is entirely removed from between the first openings.

BRIEF DESCRIPTION OF DRAWINGS

Features will be apparent to those of skill in the art by describing in detail exemplary embodiments with reference to the attached drawings in which.

DETAILED DESCRIPTION

Figure 1:
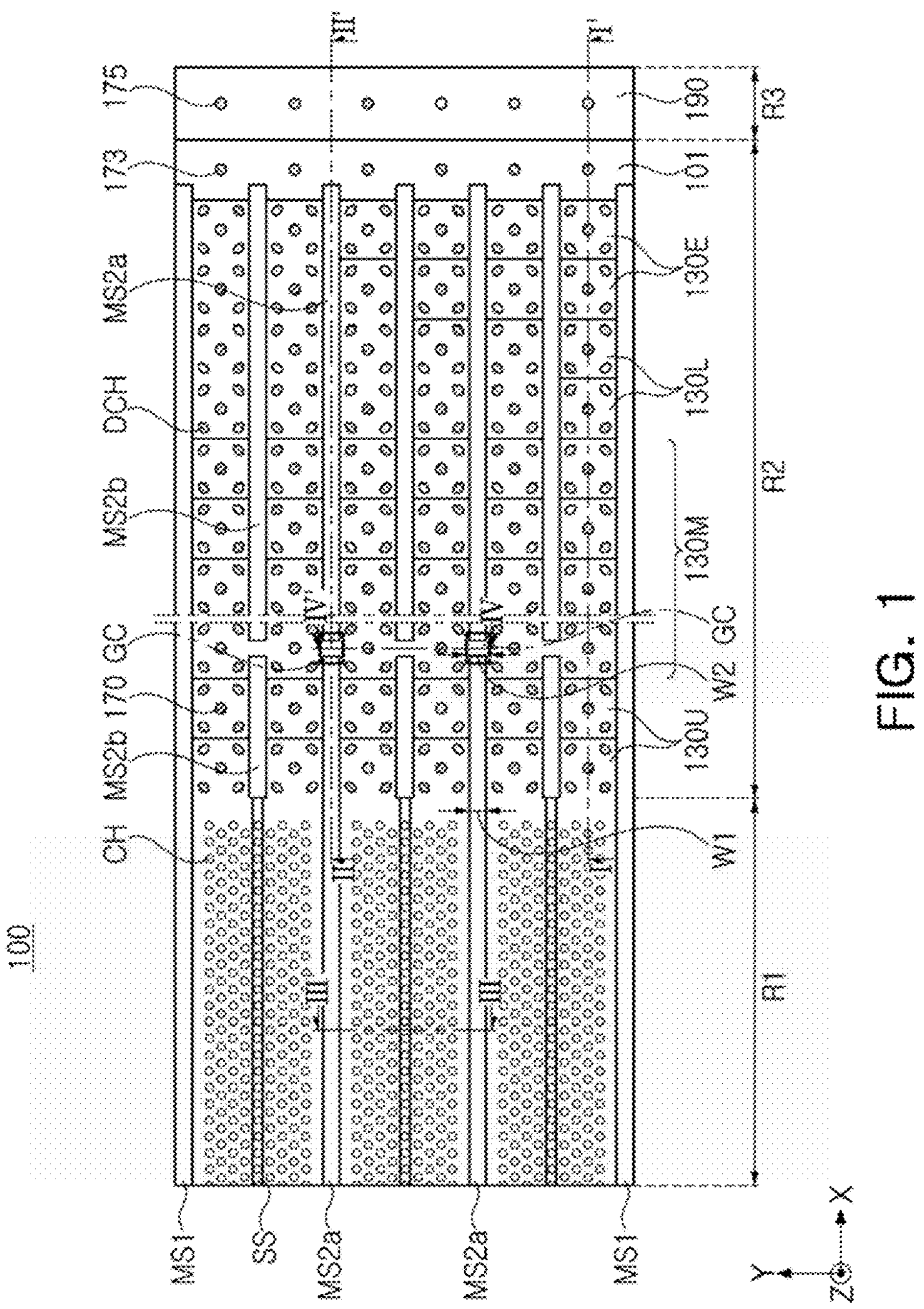
FIG. 1 is a schematic plan view of a semiconductor device according to example embodiments.

FIG. 1 is a schematic plan view of a semiconductor device according to example embodiments.

FIGS. 2A to 2D are schematic cross-sectional views of a semiconductor device according to example embodiments. FIGS. 2A to 2D illustrate cross-sections of FIG. 1, taken along lines I-I', II-II', III-III', and IV-IV', respectively.

Figure 3A:
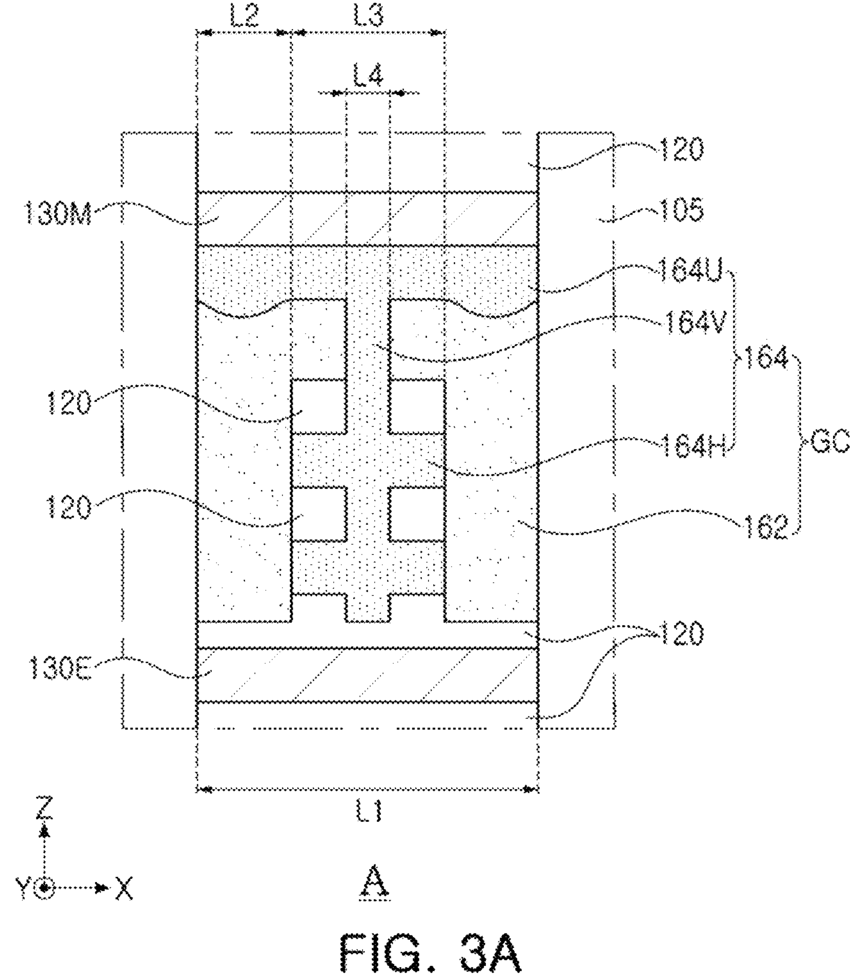
FIGS. 3A and 3B are partially enlarged views of regions of a semiconductor device according to example embodiments.
Figure 3B:
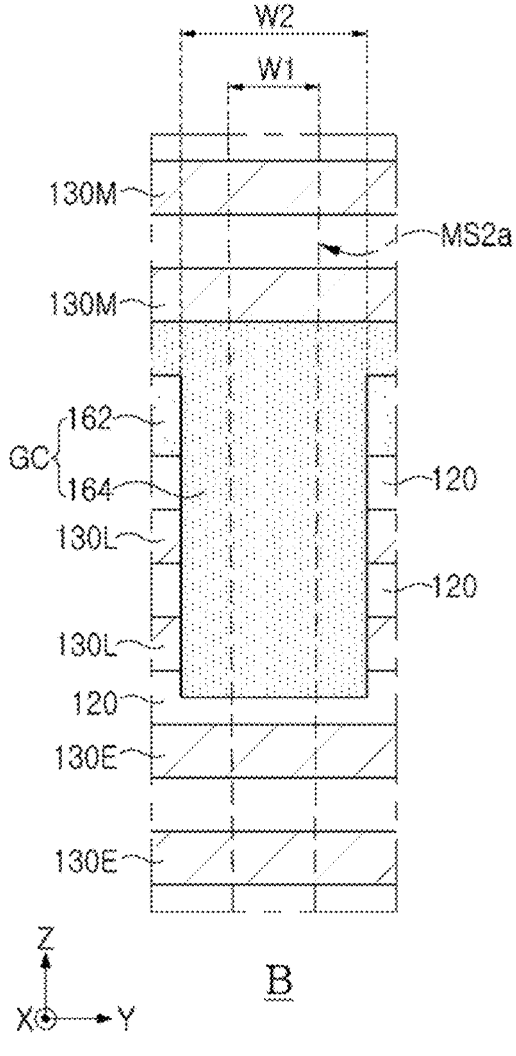

FIGS. 3A and 3B are partially enlarged views of regions of a semiconductor device according to example embodiments. FIGS. 3A and 3B are enlarged views illustrating portion 'A' of FIG. 2B and portion 'B' of FIG. 2D, respectively.

Referring to FIGS. 1 to 3B, a semiconductor device 100 may include a peripheral circuit region PERI that may be a first semiconductor structure including a first substrate 201, and a memory cell region CELL that may be a second semiconductor structure including a second substrate 101. The memory cell region CELL may be on the peripheral circuit region PERI. In an implementation, the memory cell region CELL may be below the peripheral circuit region PERI.

The peripheral circuit region PERI may include the first substrate 201, source/drain regions 205 and device separation layers 210, in the first substrate 201, and circuit devices 220, circuit contact plugs 270, circuit wiring lines 280, and a peripheral region insulating layer 290, on the first substrate 201.

The first substrate 201 may have an upper surface extending in X and Y-directions (e.g., in an X-Y plane). An active region may be defined in the first substrate 201 by the device separation layers 210. The source/drain regions 205 including impurities may be in a portion of the active region. The first substrate 201 may include a semiconductor material, e.g., a group IV semiconductor, a group III-V compound semiconductor, or a group II-VI compound semiconductor. The first substrate 201 may be a bulk wafer or an epitaxial layer. As used herein, the term "or" is not an exclusive term, e.g., "A or B" would include A, B, or A and B.

The circuit devices 220 may include planar transistors. Each of the circuit devices 220 may include a circuit gate dielectric layer 222, a spacer layer 224, and a circuit gate electrode 225. The source/drain regions 205 may be in the first substrate 201 at both sides of the circuit gate electrode 225.

The circuit contact plugs 270 and the circuit wiring lines 280 may form a circuit wiring structure electrically connected to the circuit devices 220 and the source/drain regions 205. The circuit contact plugs 270 may have a cylindrical shape, and the circuit wiring lines 280 may have a linear shape. The circuit contact plugs 270 and the circuit wiring lines 280 may include a conductive material, e.g., tungsten (W), copper (Cu), aluminum (Al), or the like, and each of the circuit contact plugs 270 and the circuit wiring lines 280 may further include a diffusion barrier. In an implementation, the number of layers and arrangement of the circuit contact plugs 270 and the circuit wiring lines 280 may be variously changed.

The peripheral region insulating layer 290 may be on the first substrate 201 to cover the circuit device 220. The peripheral region insulating layer 290 may be formed of an insulating material, and may include one or more insulating layers.

The memory cell region CELL may have first to third regions R1, R2, and R3, and may include the second substrate 101, gate electrodes 130 stacked on the second substrate 101, interlayer insulating layers 120 alternately stacked with the gate electrodes 130, channel structures CH in the first region R1 and passing through a stack structure of the gate electrodes 130, first and second separation regions MS1, MS2*a* and MS2*b* passing through the stack structure of the gate electrodes 130 and extending (e.g., lengthwise in the X direction), a lower separation region GC passing through lower gate electrodes 130L among the gate electrodes 130 and in the second region R2, and contact plugs 170 connected to pad regions 130P of the gate electrodes 130 in the second region R2 and extending vertically (e.g., in a Z direction). As used herein, the terms "first," "second," and the like are merely for identification and differentiation, and are not intended to imply or require sequential inclusion (e.g., a third element and a fourth element may be described without implying or requiring the presence of a first element or second element).

The memory cell region CELL may further include a substrate insulating layer 121, first and second horizontal conductive layers 102 and 104 below the gate electrodes 130, a horizontal insulating layer 110 below the gate electrodes 130 in the second region R2, upper separation regions SS passing through a portion of the gate electrodes 130, support structures DCH in the second region R2 and passing through the stack structure of the gate electrodes 130, substrate contacts 173 connected to the second substrate 101 and extending vertically, through-vias 175 extending from the memory cell region CELL to the peripheral circuit region PERI, upper contact plugs 180 on the channel structures CH and the contact plugs 170, and a cell region insulating layer 190 covering the gate electrodes 130.

In the memory cell region CELL, the first region R1 may be a region in which the gate electrodes 130 are vertically stacked and the channel structures CH are disposed, and may be a region in which memory cells are disposed. The second region R2 may be a region in which the gate electrodes 130 extend to have different lengths, and may correspond to a region for electrically connecting the memory cells to the peripheral circuit region PERI, together with the third region R3. The second region R2 may be disposed at at least one end of the first region R1 in at least one direction, e.g., the X-direction. The third region R3 may be at an outer side of the second region R2, and may be a region in which the second substrate 101 is not disposed.

The second substrate 101 may have a plate layer shape, and may function as at least a portion of a common source line of the semiconductor device 100. The second substrate 101 may have an upper surface extending in the X and Y-directions. The second substrate 101 may include a conductive material. In an implementation, the second substrate 101 may include a semiconductor material, e.g., a group IV semiconductor, a group III-V compound semiconductor, or a group II-VI compound semiconductor. In an implementation, the group IV semiconductor may include silicon, germanium, or silicon-germanium. The second substrate 101 may further include impurities. The second substrate 101 may be a polycrystalline semiconductor layer such as a polycrystalline silicon layer, or an epitaxial layer.

The first and second horizontal conductive layers 102 and 104 may be sequentially stacked on the upper surface of the second substrate 101 in the first region R1. The first horizontal conductive layer 102 may not extend to the second region R2, and the second horizontal conductive layer 104 may extend to the second region R2. The first horizontal conductive layer 102 may function as a portion of the common source line of the semiconductor device 100, and may function, e.g., as the common source line together with the second substrate 101. As illustrated in the enlarged view of FIG. 2C, the first horizontal conductive layer 102 may be directly connected to a channel layer 140 around the channel layer 140.

The second horizontal conductive layer 104 may be in contact with the second substrate 101 in regions of the second region R2 in which the first horizontal conductive layer 102 and the horizontal insulating layer 110 are not disposed. The second horizontal conductive layer 104 may cover an end portion of the first horizontal conductive layer 102 or the horizontal insulating layer 110 in the regions, and may be bent therein to extend onto the second substrate 101. In an implementation, the regions may be in contact with outer side surfaces of the first and second separation regions MS1, MS2*a* and MS2*b* in the second region R2, and may be a region surrounding the first and second separation regions MS1, MS2*a* and MS2*b*.

The first and second horizontal conductive layers 102 and 104 may include a semiconductor material, e.g. polycrystalline silicon. In this case, at least, the first horizontal conductive layer 102 may be a layer doped with impurities of the same conductivity type as that of the second substrate 101, and the second horizontal conductive layer 104 may be a doped layer or may be a layer including impurities diffused from the first horizontal conductive layer 102. In an implementation, a material of the second horizontal conductive layer 104 may include an insulating layer.

The horizontal insulating layer 110 may be on the second substrate 101 on the same level as the first horizontal conductive layer 102 in at least a portion of the second region R2. The horizontal insulating layer 110 may include first and second horizontal insulating layers 111 and 112 alternately stacked on the second substrate 101 in the second region R2. The horizontal insulating layer 110 may be layers remaining after being partially replaced with the first horizontal conductive layer 102 in a process of manufacturing the semiconductor device 100.

The horizontal insulating layer 110 may include silicon oxide, silicon nitride, silicon carbide, or silicon oxynitride. The first horizontal insulating layers 111 and the second horizontal insulating layer 112 may include different insulating materials. In an implementation, the first horizontal insulating layers 111 may be formed of the same material as the interlayer insulating layers 120, and the second horizontal insulating layer 112 may be formed of a different material from the interlayer insulating layers 120.

The substrate insulating layer 121 may be in the third region R3 and may pass through the second substrate 101, the horizontal insulating layer 110, and the second horizontal conductive layer 104. The substrate insulating layer 121 may further be in the first region R1 and the second region R2, and may be, e.g., in a region in which the through-vias 175 are disposed. A lower surface of the substrate insulating layer 121 may be coplanar with a lower surface of the second substrate 101 or may be on a level lower than the lower surface of the second substrate 101. The substrate insulating layer 121 may include an insulating material, e.g., silicon oxide, silicon nitride, silicon carbide, or silicon oxynitride.

The gate electrodes 130 may be stacked on the second substrate 101 to be vertically spaced apart, to form a stack structure, together with the interlayer insulating layers 120. The stack structure may include a lower stack structure and an upper stack structure, vertically stacked. In an implementation, the stack structure may be formed as a single stack structure.

The gate electrodes 130 may include, from the bottom, erase gate electrodes 130E constituting an erase transistor used for an erase operation, lower gate electrodes 130L constituting a gate of a ground select transistor, memory gate electrodes 130M constituting a plurality of memory cells, and upper gate electrodes 130U constituting gates of string select transistors. The number of memory gate electrodes 130M constituting memory cells may be determined according to capacity of the semiconductor device 100. In an implementation, two of each of the erase gate electrodes 130E and the lower gate electrode 130L may be present. In an implementation, the erase gate electrodes 130E, the lower gate electrode 130L, and the upper gate electrodes 130U may be one or two or more, respectively, and may have the same structure as or a different structure from the memory gate electrodes 130M.

The erase gate electrodes 130E may be below the lower gate electrode 130L, and may be used for an erase operation using a gate induced drain leakage (GIDL) phenomenon. In an implementation, the erase gate electrodes 130E may further be on the upper gate electrodes 130U. In an implementation, some of the gate electrodes 130, e.g., memory gate electrodes 130M adjacent to the lower gate electrode 130L or the upper gate electrodes 130U may be dummy gate electrodes.

In an implementation, as illustrated in FIG. 1, the gate electrodes 130 may be separated from each other in the Y-direction by the first separation regions MS1 continuously extending from the first region R1 and the second region R2. In an implementation, the gate electrodes 130 between a pair of first separation regions MS1 may form one memory block. In an implementation, some of the gate electrodes 130, e.g., the memory gate electrodes 130M, may form one layer in one memory block, respectively.

The gate electrodes 130 may be vertically stacked to be spaced apart from each other in the first region R1 and the second region R2, and may extend from the first region R1 to the second region R2 at different lengths to form a stepped structure in a portion of the second region R2. The gate electrodes 130 may have a stepped structure in the Y-direction. Due to the stepped structure, among the gate electrodes 130, a lower gate electrode 130 may be extended further, as compared to an upper gate electrode 130. In an implementation, each of the gate electrodes 130 may have a region in which an upper surface is exposed in an upward direction from the interlayer insulating layers 120 and the other gate electrode 130. The region may be referred to as a pad region 130P. In each gate electrode 130, the pad region 130P may be a region including the end of the gate electrode 130 in the X-direction. The gate electrodes 130 may be respectively connected to the contact plugs 170 in the pad regions 130P. The gate electrodes 130 may have an increased thickness in the pad regions 130P.

The gate electrodes 130 may include a metal material, e.g., tungsten (W). In an implementation, the gate electrodes 130 may include a polycrystalline silicon material or a metal silicide material. In an implementation, the gate electrodes 130 may further include a diffusion barrier, and the diffusion barrier may include, e.g., tungsten nitride (WN), tantalum nitride (TaN), titanium nitride (TiN), or a combination thereof.

The interlayer insulating layers 120 may be between the gate electrodes 130. Like the gate electrodes 130, the interlayer insulating layers 120 may be spaced apart from each other in a direction (Z direction), perpendicular to the upper surface of the second substrate 101, and may extend (e.g., lengthwise) in the X-direction. The interlayer insulating layers 120 may include an insulating material, e.g., silicon oxide or silicon nitride.

The channel structures CH may form a memory cell string, respectively, and may be spaced apart from each other while forming rows and columns on the second substrate 101 in the first region R1. The channel structures CH may form a grid pattern in the X-Y plane or may be in a zigzag shape in one direction. The channel structures CH may have a columnar shape, and may have inclined side surfaces that narrow toward the second substrate 101 according to an aspect ratio. In an implementation, at least some of the channel structures CH at an end portion of the first region R1 may be dummy channels. In an implementation, as illustrated in FIG. 1, 9 channel structures CH may be arranged in a zigzag shape between adjacent first and second separation regions MS1, MS2*a*, and MS2*b* in the Y-direction. In an implementation, 14 or 19 channel structures CH may be between adjacent first and second separation regions MS1, MS2*a*, and MS2*b* in the Y-direction.

The channel structures CH may include first channel structures CH1 and second channel structures CH2, vertically stacked. The channel structures CH may have a configuration in which the first channel structures CH1 in a lower portion and the second channel structures CH2 in an upper portion are connected, and may have a bent portion due to a difference in width in a connection region. In an implementation, the number of channel structures stacked in the Z-direction may be variously changed.

Each of the channel structures CH may include a channel layer 140, a gate dielectric layer 145, a channel buried insulating layer 150, and a channel pad 155, arranged in a channel hole. As illustrated in the enlarged view of FIG. 2C, the channel layer 140 may have an annular shape surrounding the channel buried insulating layer 150 therein. In an implementation, the channel layer 140 may have a columnar shape, e.g., a cylinder or a prism, without the channel buried insulating layer 150. The channel layer 140 may be connected to the first horizontal conductive layer 102 in a lower portion. The channel layer 140 may include a semiconductor material such as polycrystalline silicon or single crystal silicon.

The gate dielectric layer 145 may be between the gate electrodes 130 and the channel layer 140. In an implementation, the gate dielectric layer 145 may include a tunneling layer, a charge storage layer, and a blocking layer, sequentially stacked from the channel layer 140. The tunneling layer may tunnel an electric charge into the charge storage layer, and may include, e.g., silicon oxide ($SiO_2$), silicon nitride ($Si_3N_4$), silicon oxynitride (SiON), or a combination thereof. The charge storage layer may be a charge trap layer or a floating gate conductive layer. The blocking layer may include, e.g., silicon oxide ($SiO_2$), silicon nitride ($Si_3N_4$), silicon oxynitride (SiON), a high-κ dielectric material, or a combination thereof. In an implementation, at least a portion of the gate dielectric layer 145 may extend along the gate electrodes 130 in a horizontal direction.

The channel pad 155 may be only on an upper end of the second channel structure CH2 in an upper portion. The channel pad 155 may include, e.g., doped polycrystalline silicon.

The channel layer 140, the gate dielectric layer 145, and the channel buried insulating layer 150 may be connected to each other between the first channel structure CH1 and the second channel structure CH2. An upper interlayer insulating layer 125 having a relatively thick thickness may be between the first channel structure CH1 and the second channel structure CH2. Thicknesses and shapes of the interlayer insulating layers 120 and the upper interlayer insulating layer 125 may be variously changed according to embodiments.

The support structures DCH may be spaced apart from each other while forming rows and columns on the second substrate 101 in the second region R2. As illustrated in FIG. 1, the support structures DCH may surround each of the contact plugs 170 in four directions. In an implementation, an arrangement of the support structures DCH may be variously changed. The support structures DCH may have a columnar shape, and may have inclined side surfaces that narrow toward the second substrate 101 according to an aspect ratio.

The support structures DCH may have a circular shape, an elliptical shape, or a similar shape in the X-Y plane. In an implementation, a diameter or a maximum width of the support structures DCH may be greater than that of the channel structures CH. The support structures DCH may have internal structures, equal to or different from internal structures of the channel structures CH. In an implementation, the support structures DCH may not include a conductive layer, and may include an insulating material, e.g., silicon oxide, silicon nitride, or silicon oxynitride.

The first and second separation regions MS1, MS2*a*, and MS2*b* may extend (e.g., lengthwise) in the X-direction through the gate electrodes 130. The first and second separation regions MS1, MS2*a*, and MS2*b* may be parallel to each other. The first and second separation regions MS1, MS2*a*, and MS2*b* may pass entirely through the gate electrodes 130 stacked on the second substrate 101, and may further pass through the first and second horizontal conductive layers 102 and 104 and the horizontal insulating layer 110, to be connected to the second substrate 101. The first separation regions MS1 may extend as a single layer (e.g., continuously) in the X-direction, and the second separation regions MS2*a* and MS2*b* may intermittently (e.g., discontinuously) extend between a pair of first separation regions MS1 or may be only in some regions. In an implementation, a second central separation regions MS2*a* may continuously extend as a single layer in the first region R1, and may discontinuously extend in the second region R2 in the X-direction. A second auxiliary separation region MS2*b* may be only in the second region R2, and may discontinuously extend in the X-direction. In an implementation, an arrangement order and the number of the first and second separation regions MS1, MS2*a*, and MS2*b* may vary.

A separation insulating layer 105 may be in the first and second separation regions MS1, MS2*a*, and MS2*b*. In an implementation, the separation insulating layer 105 may have a shape in which a width decreases toward the second substrate 101 due to a high aspect ratio, or may have a side surface, perpendicular to the upper surface of the second substrate 101. The separation insulating layer 105 may include an insulating material, e.g., silicon oxide, silicon nitride, or silicon oxynitride.

Figure 2A:
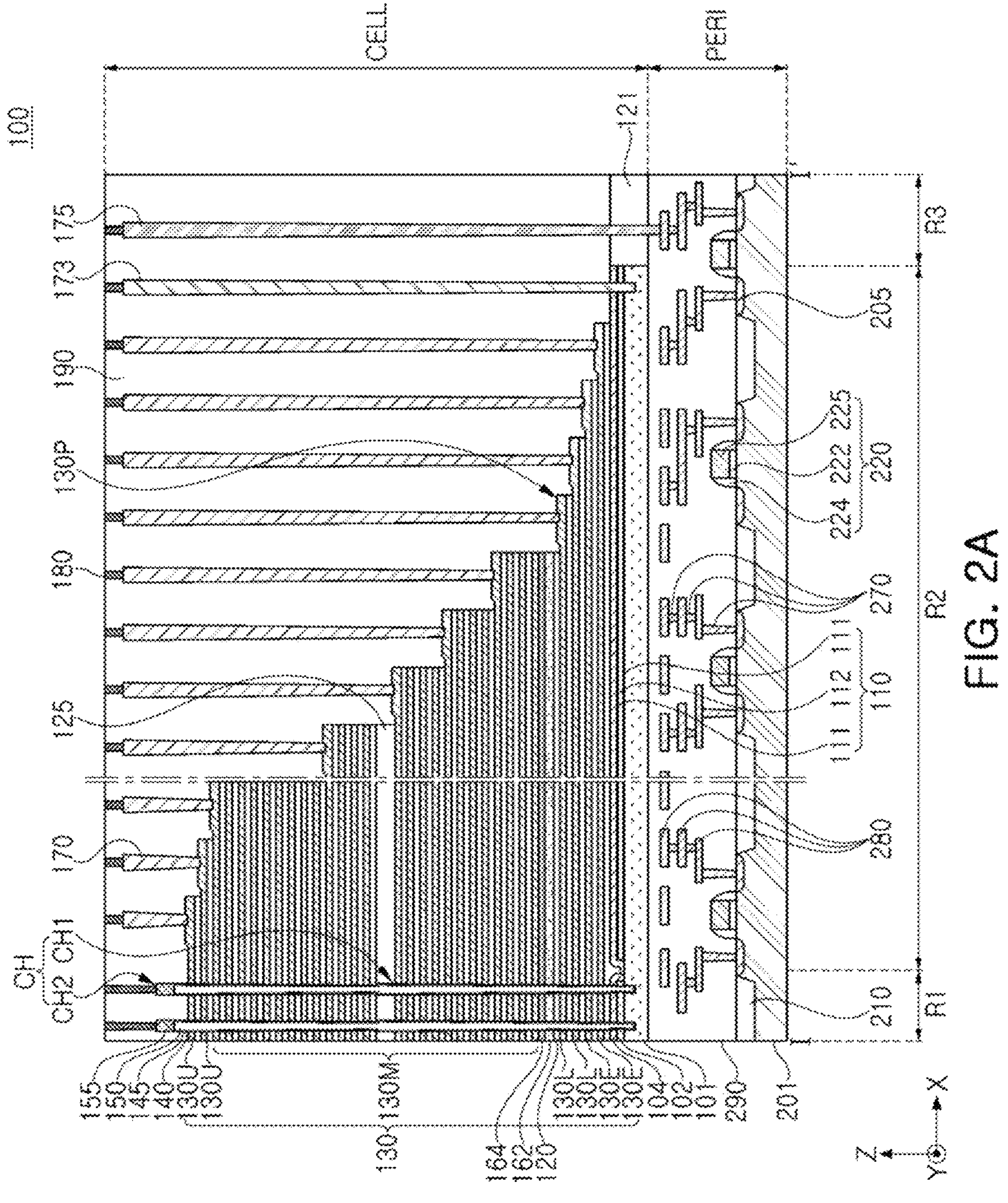
FIGS. 2A to 2D are schematic cross-sectional views of a semiconductor device according to example embodiments.
Figure 2B:
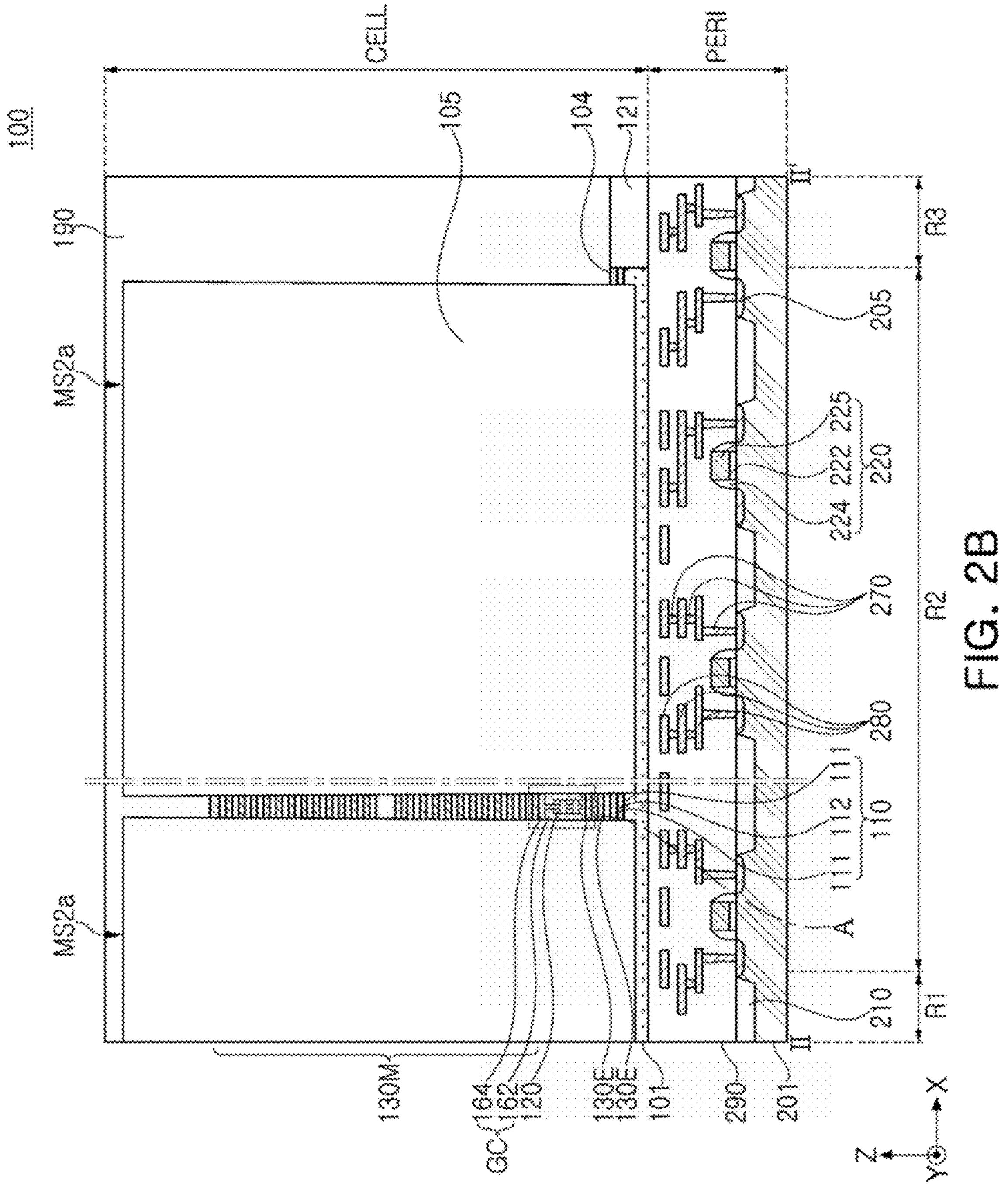
Figure 2C:
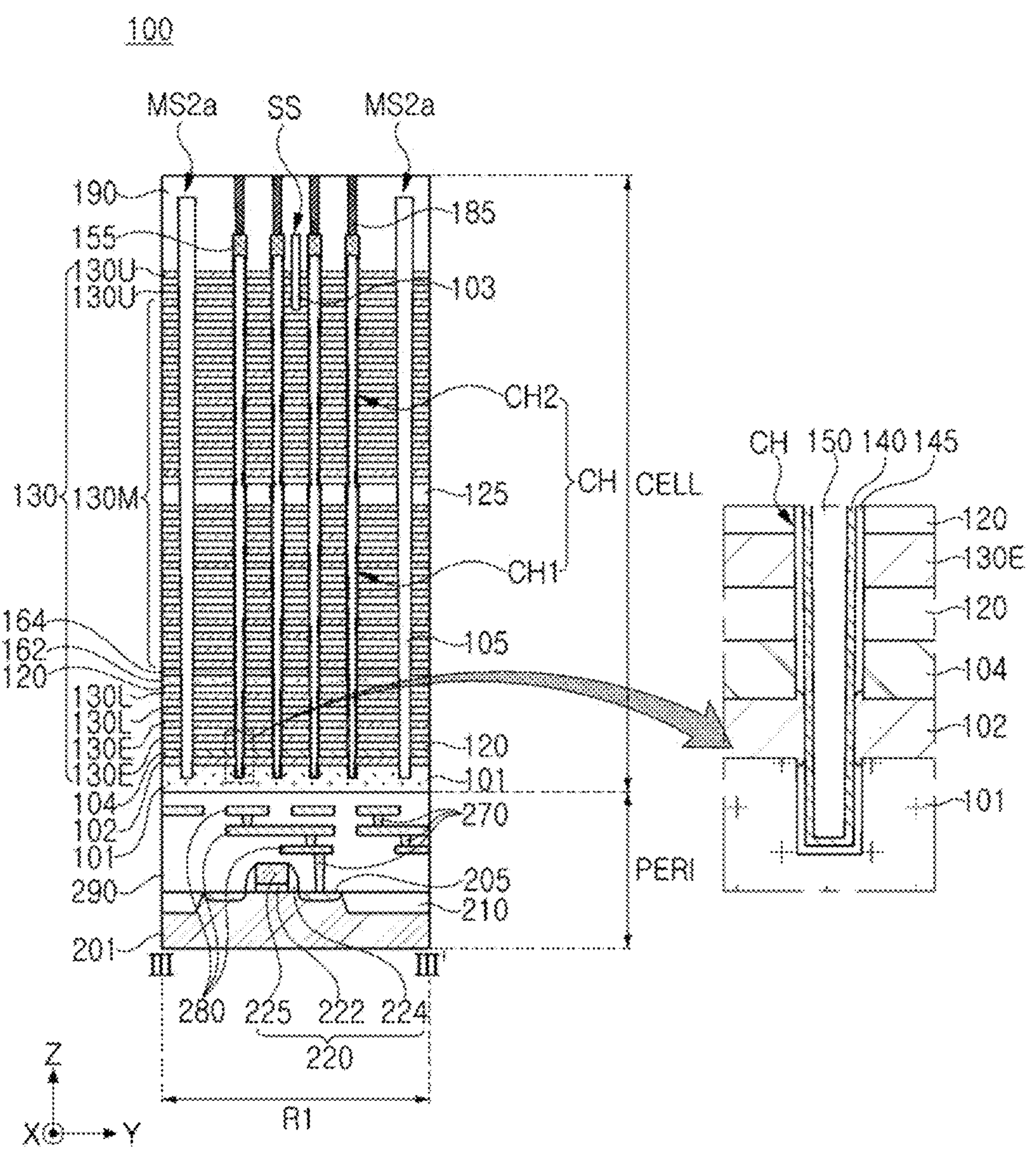
Figure 2D:
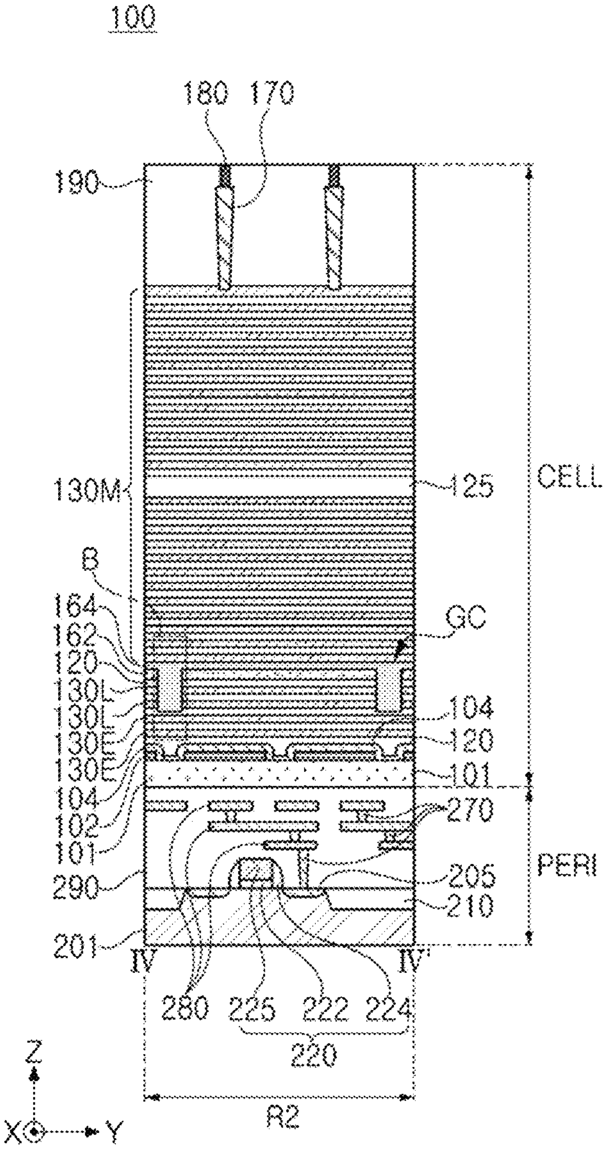

The upper separation regions SS may extend in the first region R1 between the first separation regions MS1 and the second central separation region MS2*a* and between the second central separation region MS2*a* in the X-direction, as illustrated in FIG. 1. The upper separation regions SS may be in a portion of the second region R2 and the first region R1 to pass through gate electrodes 130 including an uppermost upper gate electrode 130U among the gate electrodes 130. As illustrated in FIG. 2C, the upper separation regions SS may separate, e.g., a total of three gate electrodes 130 from each other in the Y-direction. In an implementation, the number of gate electrodes 130 separated by the upper separation regions SS may be variously changed. The upper separation regions SS may include an upper separation insulating layer 103. The upper separation insulating layer 103 may include an insulating material, e.g., silicon oxide, silicon nitride, or silicon oxynitride.

The lower separation regions GC may pass through the lower gate electrodes 130L in a portion of the second region R2. In an implementation, as illustrated in FIG. 1, each of the lower separation regions GC may be in a region including a region between the second central separation regions MS2*a* spaced apart from each other in the X-direction in the second region R2, in a plan view. The lower separation region GC may be in contact with the second central separation regions MS2*a* on both sides in the X-direction. The lower separation region GC may have a shape such as a rectangle, a rounded rectangle shape, or an elliptical shape, in a plan view. The lower gate electrodes 130L may be separated from each other or divided into a plurality between the pair of first separation regions MS1 by the first insulating region GS and the second central separation regions MS2*a* arranged in a row in the X-direction. This will be described in more detail with reference to FIG. 4 below.

As illustrated in FIG. 3A, the lower separation region GC may include first filling insulating layers 162 passing through the lower gate electrodes 130L and spaced apart from each other in the X-direction and a second filling insulating layer 164 between the first filling insulating layers 162. The first filling insulating layers 162 may extend above an upper surface of the interlayer insulating layer 120 on the lower gate electrode 130L in an upper portion. Each of the first filling insulating layers 162 may have a depression having a downward convex shape on an upper surface, in a region from which the lower gate electrodes 130L has been removed. The second filling insulating layer 164 may include a vertical region 164V extending vertically in a central portion, horizontal regions 164H extending horizontally (e.g., outwardly) from the vertical region 164V and on the same level as the lower gate electrodes 130L, and an upper region 164U on the upper surface of the first filling insulating layers 162 in an uppermost portion. The upper region 164U may fill the depressions in the first filling insulating layers 162, and may have a substantially planar upper surface.

The first and second filling insulating layers 162 and 164 may horizontally extend along an upper surface of the interlayer insulating layer 120 on the lower gate electrode 130L in an upper portion, into an entire region including the first region R1. In an implementation, the first and second filling insulating layers 162 and 164 in a region in which the first and second filling insulating layers 162 and 164 pass through the lower gate electrodes 130L may be referred to as the lower separation region GC.

The lower separation region GC may have a second width W2, wider than a first width W1 of the second central separation regions MS2*a*, in the Y-direction. The second width W2 may correspond to an entire width of the first and second filling insulating layers 162 and 164 in the lower separation region GC. In an implementation, the second width W2 may be equal to or narrower than the first width W1. In the lower separation region GC, a first length L1 in the X-direction may be greater than the width W2 in the Y-direction. In an implementation, the first length L1 may range from about 500 nm to about 2,000 nm, e.g., from about 800 nm to about 1,600 nm. In an implementation, second length L2 of the first filling insulating layer 162 (e.g., in the X direction) may be greater than a third length L3 of the horizontal region 164H of the second filling insulating layer 164. A fourth length L4 of the vertical region 164V of the second filling insulating layer 164 (e.g., in the X direction) may be shorter than the second length L2.

The first and second filling insulating layers 162 and 164 may include an insulating material, e.g., silicon oxide, silicon nitride, or silicon oxynitride. The first filling insulating layers 162 and the second filling insulating layer 164 may include the same material or different materials. In an implementation, the first and second filling insulating layers 162 and 164 may include the same material as the interlayer insulating layers 120. In this case, an interface between the first filling insulating layers 162 and the second filling insulating layer 164 and an interface between the first and second filling insulating layers 162 and 164 and the interlayer insulating layers 120 may not be distinguishable.

In an implementation, the first filling insulating layers 162 may include the same material as the interlayer insulating layers 120, and the second filling insulating layer 164 may include a different material from the interlayer insulating layers 120. In this case, an interface between the first filling insulating layers 162 and the second filling insulating layer 164 may be distinguishable. In an implementation, the first filling insulating layers 162 may include silicon oxide, and the second filling insulating layer 164 may include silicon oxynitride or may include silicon oxide including impurities. The impurity may be, e.g., carbon (C) or nitrogen (N).

In the lower separation region GC, the first filling insulating layers 162 and the second filling insulating layer 164 may be formed by different processes. In an implementation, the lower separation region GC may not include a single insulating layer formed in one process, but rather may include the first and second filling insulating layers 162 and 164 formed by different processes as described above, and gate electrodes 130 formed on the lower separation region GC may have planar upper and lower surfaces. In an implementation, the lower gate electrodes 130L may include a plurality of lower gate electrodes 130L, a lowermost memory gate electrode 130M may not have a chevron shape, e.g., curved in a downward direction to face the lower separation region GC, and may have substantially planar upper and lower surfaces. Therefore, defects such as occurrence of leakage current between the gate electrodes 130 may be prevented.

The contact plugs 170 may be connected to the pad regions 130P of the uppermost gate electrodes 130 in the second region R2. The contact plugs 170 may pass through at least a portion of the cell region insulating layer 190, and may be connected to each of the pad regions 130P of the gate electrodes 130 exposed in an upward direction. In an implementation, the contact plugs 170 may pass through the gate electrodes 130 below the pad regions 130P, and may pass through the horizontal insulating layer 110, the second horizontal conductive layer 104, and the substrate 101, to be connected to the circuit wiring lines 280 in the peripheral circuit region PERI. In this case, the contact plugs 170 may be spaced apart from the gate electrodes 130 below the pad regions 130P by a separate insulating layer, and may also be spaced apart from the second horizontal conductive layer 104 and the second substrate 101.

The contact plugs 170 may include a conductive material, e.g., tungsten (W), copper (Cu), aluminum (Al), or an alloy thereof. In an implementation, the contact plugs 170 may have an air gap therein.

The substrate contacts 173 may pass through the cell region insulating layer 190, and may be connected to the second substrate 101. The substrate contacts 173 may have the same or a similar shape to the contact plugs 170, and may include the same material as the contact plugs 170.

The through-vias 175 may be outside the second substrate 101, and may extend through the memory cell region CELL to the peripheral circuit region PERI. The through-vias 175 may connect the upper contact plugs 180 of the memory cell region CELL and the circuit wiring lines 280 of the peripheral circuit region PERI. In an implementation, the through-vias 175 may pass through a stack structure of sacrificial layers 118 and the interlayer insulating layers 120, in a region in which the sacrificial layers 118 (refer to FIG. 14A) remain without being replaced with the gate electrodes 130. The through-vias 175 may include a conductive material, e.g., tungsten (W), copper (Cu), aluminum (Al), or an alloy thereof.

The upper contact plugs 180 may constitute a cell wiring structure electrically connected to the memory cells in the memory cell region CELL. The upper contact plugs 180 may be connected to the channel structures CH, the contact plugs 170, the substrate contacts 173, and the through-vias 175, and may be electrically connected to the channel structures CH and the gate electrodes 130. In an implementation, as illustrated in the drawings, the upper contact plugs 180 may have the form of a plug, or may have a linear form. In an implementation, the number of plugs and wiring lines constituting the cell wiring structure may be variously changed. The upper contact plugs 180 may include metal, e.g., tungsten (W), copper (Cu), aluminum (Al), or the like.

The cell region insulating layer 190 may cover the second substrate 101, the gate electrodes 130 on the second substrate 101, and the peripheral region insulating layer 290. The cell region insulating layer 190 may be formed of an insulating material, and may be provided as a plurality of insulating layers.

Figure 4:
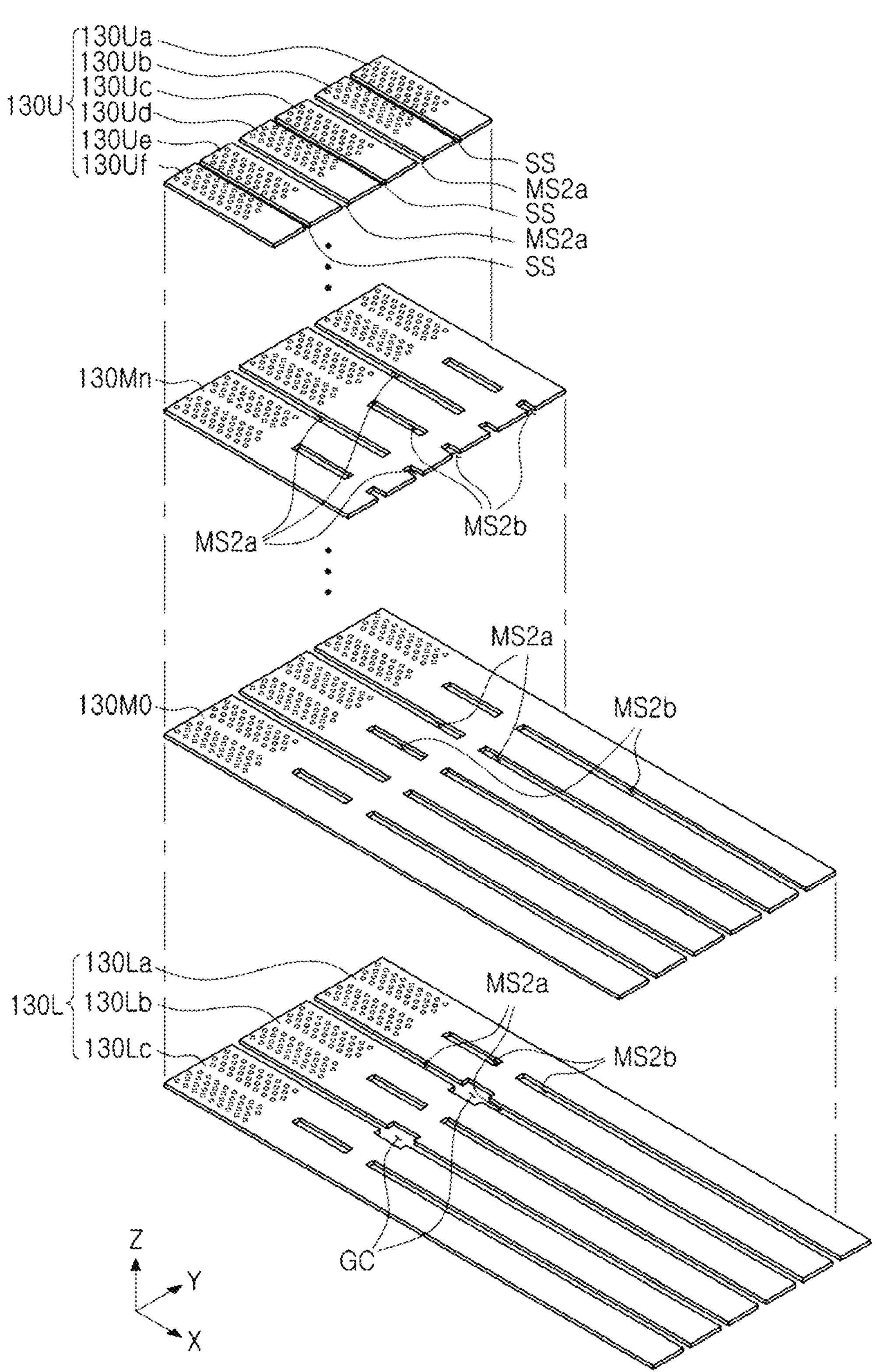
FIG. 4 is an exploded perspective view of gate electrodes of a semiconductor device according to example embodiments.

FIG. 4 is an exploded perspective view of gate electrodes of a semiconductor device according to example embodiments.

Referring to FIG. 4, some of the gate electrodes 130 between the pair of first separation regions MS1 of FIG. 1 are illustrated.

The upper gate electrode 130U in the upper portion of the gate electrodes 130 may be a string select line. The upper gate electrode 130U may be separated into six sub-upper gate electrodes 130Ua, 130Ub, 130Uc, 130SUd, 130Ue, and 130Uf in the Y-direction by the upper insulating regions SS and the second central separation regions MS2*a*. The sub-upper gate electrodes 130Ua, 130Ub, 130Uc, 130SUd, 130Ue, and 130Uf may be connected to different contact plugs, respectively, to independently receive an electrical signal. In an implementation, two uppermost gate electrodes 130 of the gate electrodes 130 may correspond to the upper gate electrode 130U, or the number of the upper gate electrodes 130U may be changed.

A memory gate electrode 130Mn below the upper gate electrode 130U may have grooves formed by the second separation regions MS2*a* and MS2*b*, and may be one layer. A lowermost memory gate electrode 130M0 may also have regions through which the second separation regions MS2*a* and MS2*b* pass, or may be one layer. In FIG. 4, an uppermost memory gate electrode 130Mn and the lowermost memory gate electrode 130M0, among the memory gate electrodes 130M, are illustrated, and other memory gate electrodes 130M may be a single layer in a similar manner, respectively.

Among the gate electrodes 130, the lower gate electrode 130L below the memory gate electrodes 130M may be a ground select line, and may be divided into three sub-lower gate electrodes 130La, 130Lb, and 130Lc by the lower separation regions GC and the second central separation regions MS2*a*. Each of the lower separation regions GC may connect the second central separation regions MS2*a* arranged side by side in the X-direction, to completely divide the lower gate electrode 130L in the Y-direction. The sub-lower gate electrodes 130La, 130Lb, and 130Lc may be connected to different contact plugs, respectively, to independently receive an electrical signal. In an implementation, the number of sub-lower gate electrodes 130Ga, 130Gb, and 130Gc between the pair of first separation regions MS1 may be variously changed within a range of two or more. In an implementation, the erase gate electrodes 130E (refer to FIG. 1) may also include a plurality of sub-gate electrodes, similar to the lower gate electrode 130L. However, the erase gate electrodes 130E may receive the same electrical signal.

Figure 5A:
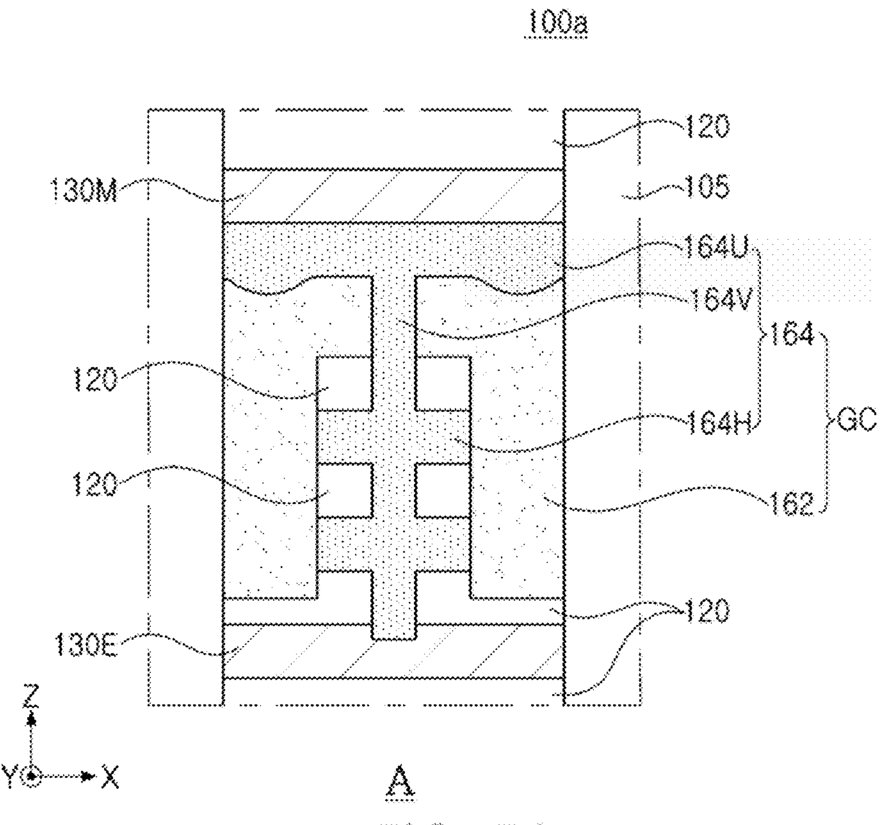
FIGS. 5A to 5C are schematic partially enlarged views of a semiconductor device according to example embodiments.
Figure 5B:
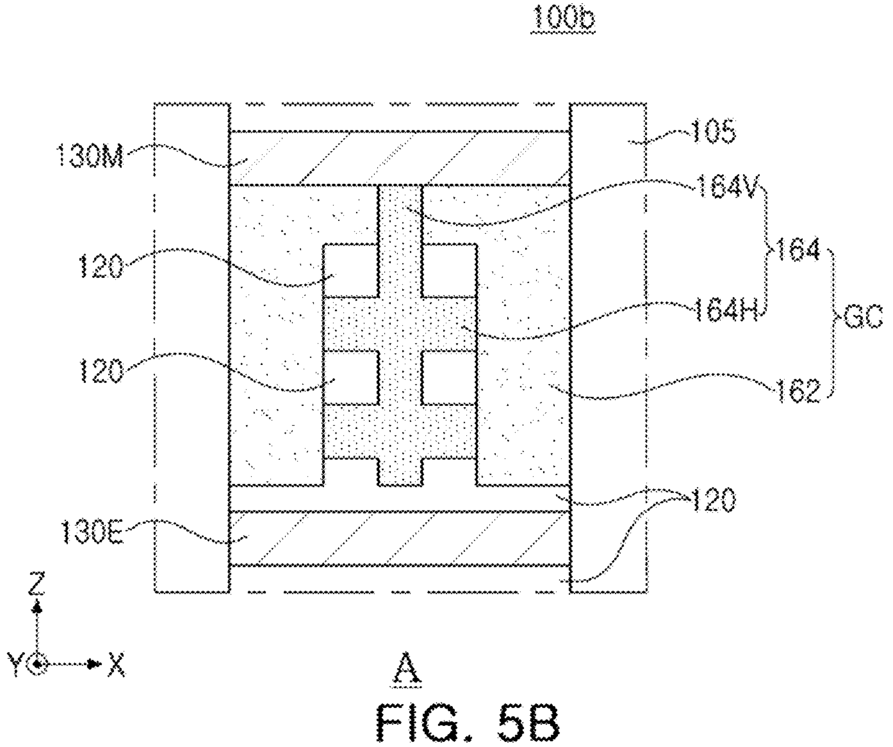
Figure 5C:
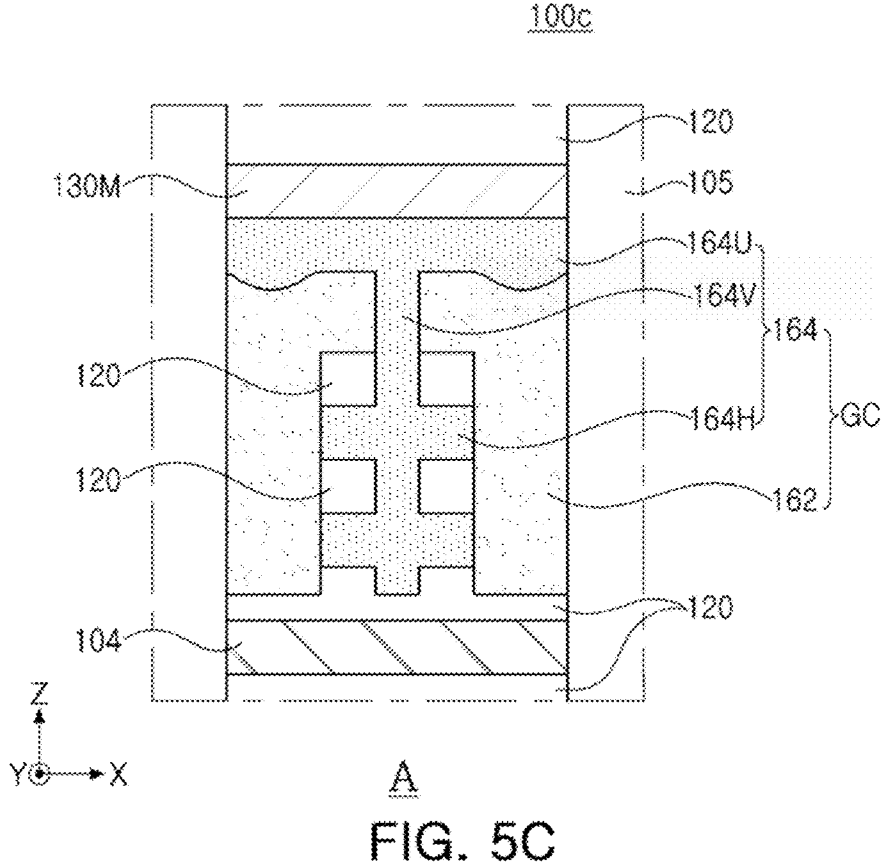

FIGS. 5A to 5C are schematic partially enlarged views of a semiconductor device according to example embodiments. FIGS. 5A and 5B illustrate a region corresponding to FIG. 3A, and FIG. 5C illustrates a region including the region corresponding to FIG. 3A.

Referring to FIG. 5A, in a lower separation region GC of a semiconductor device 100*a*, a position of a lower end of a vertical region 164V of a second filling insulating layer 164 may be different from that of the embodiment of FIG. 3A. In an implementation, the lower end of the vertical region 164V may partially recess (e.g., penetrate) an erase gate electrode 130E. Therefore, the erase gate electrode 130E may have a depression formed by the vertical region 164V on an upper surface. A depth of the depression may be variously changed according to embodiments. In an implementation, lower ends of first filling insulating layers 162 may also partially penetrate the erase gate electrode 130E.

Such a structure may be manufactured by forming a second opening OP2 to partially recess a first sacrificial layer 118E which forms the erase gate electrode 130E, during a process of forming the second opening OP2, which will be described below with reference to FIGS. 11A to 11D.

Referring to FIG. 5B, in a lower separation region GC of a semiconductor device 100*b*, first filling insulating layers 162 may have a planar upper surface, without depressions in the upper surface, unlike the embodiment of FIG. 3A. Also, a second filling insulating layer 164 may have only a vertical region 164V and a horizontal regions 164H without an upper region 164U (refer to FIG. 3A). Therefore, the second filling insulating layer 164 may not extend outside the lower separation region GC, such as into a first region R1 or the like, but may be only in the lower separation region GC.

In an implementation, upper surfaces of the first and second filling insulating layers 162 and 164 may have a reduced thickness to be coplanar with an upper surface of an interlayer insulating layer 120 on an upper surface of an upper lower gate electrode 130L. In this case, the first filling insulating layers 162 may not extend outside of the lower separation region GC, and may be only in the lower separation region GC.

Such a structure may be manufactured by adjusting depths of the first and second filling insulating layers 162 to be removed, during a planarization process for the first and second filling insulating layers 162 and 164, which will be described with reference to FIGS. 14A and 14B below.

Referring to FIG. 5C, in a semiconductor device 100*c*, gate electrodes 130 may not include erase gate electrodes 130E, unlike in the embodiment of FIGS. 1 to 3B. Therefore, first and second filling insulating layers 162 and 164 constituting a lower separation region GC may be located on a second horizontal conductive layer 104. As such, in some embodiments, the erase gate electrodes 130E may be omitted, or the number of erase gate electrodes 130E may be changed.

Figure 6:
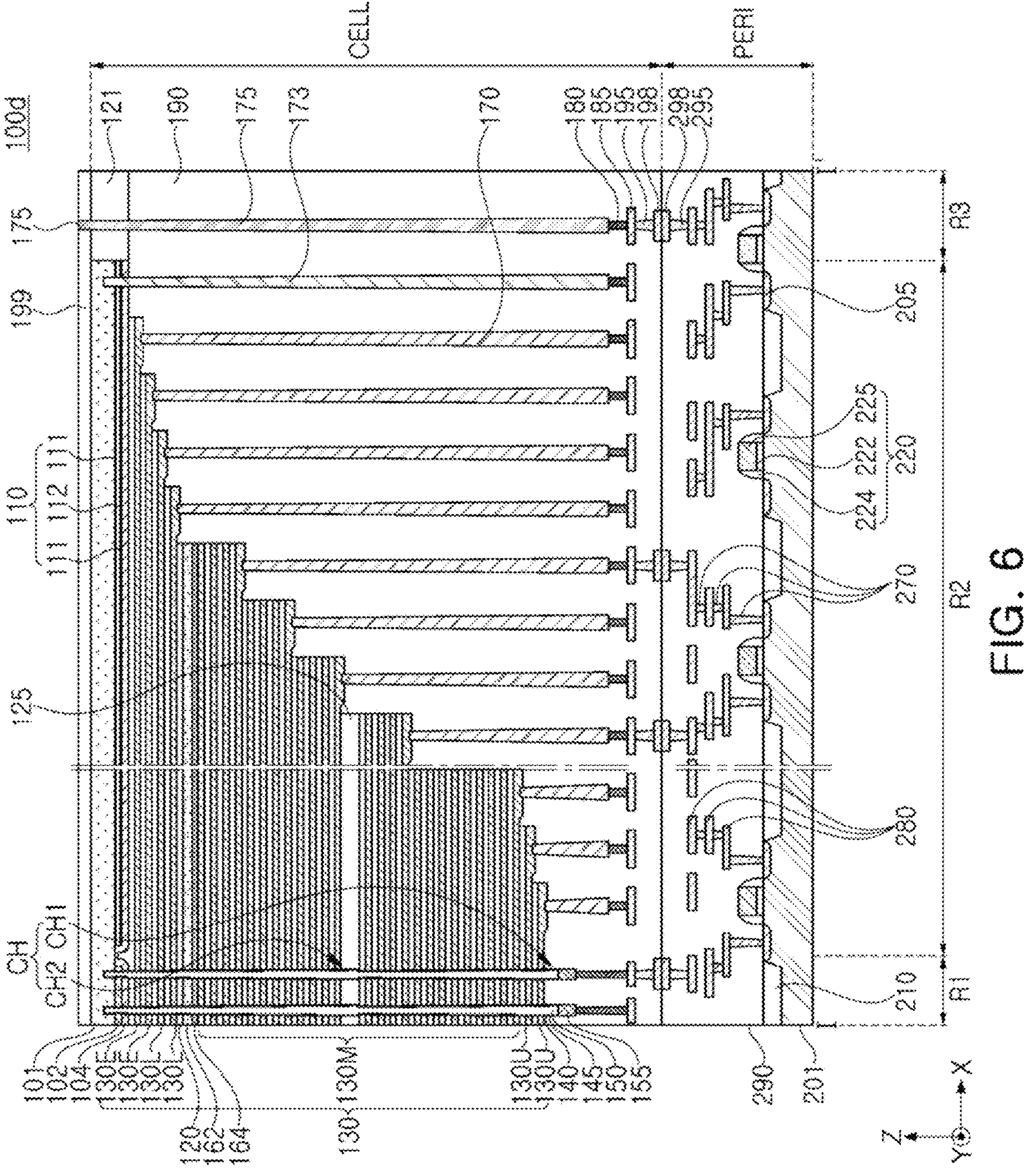
FIG. 6 is a schematic cross-sectional view of a semiconductor device according to example embodiments.

FIG. 6 is a schematic cross-sectional view of a semiconductor device according to example embodiments. FIG. 6 illustrates a region corresponding to FIG. 2A.

Referring to FIG. 6, a semiconductor device 100*d* may have a structure in which a peripheral circuit region PERI and a memory cell region CELL are vertically bonded in a wafer bonding method. To this end, the peripheral circuit region PERI may further include first bonding vias 295 and first bonding pads 298, and the memory cell region CELL may further include cell wiring lines 185, second bonding vias 195, second bonding pads 198, and a passivation layer 199 on a second substrate 101.

The first bonding vias 295 may be on an uppermost circuit wiring lines 280 to be connected to circuit wiring lines 280. At least a portion of the first bonding pads 298 may be connected to the first bonding vias 295 on the first bonding vias 295. The first bonding pads 298 may be connected to the second bonding pads 198 of the memory cell region CELL. The first bonding pads 298 together with the second bonding pads 198 may provide an electrical connection path according to junction of the peripheral circuit region PERI and the memory cell region CELL. The first bonding vias 295 and the first bonding pads 298 may include a conductive material, e.g., copper (Cu).

The cell wiring lines 185 may be below upper contact plugs 180, and may be connected to the second bonding vias 195. The cell wiring lines 185 may be formed of a conductive material, e.g., tungsten (W), aluminum (Al), or copper (Cu).

The second bonding vias 195 and the second bonding pads 198 may be below the cell wiring lines 185. The second bonding vias 195 may connect the cell wiring lines 185 and the second bonding pads 198, and the second bonding pads 198 may be joined to the first bonding pads 298 of the peripheral circuit region PERI. The second bonding vias 195 and the second bonding pads 198 may include a conductive material, e.g., copper (Cu).

The passivation layer 199 may be on the second substrate 101 to protect the second substrate 101, and may include an insulating material. Upper surfaces of through-vias 175 may be exposed through the passivation layer 199 to be used as an input/output pad or the like. Structures of upper ends of the through-vias 175 may not be necessarily exposed, and may be variously changed according to embodiments.

The peripheral circuit region PERI and the memory cell region CELL may form a semiconductor structure, respectively, and may be joined in copper (Cu)-copper (Cu) bonding by the first bonding pads 298 and the second bonding pads 198. In addition to the copper (Cu)-copper (Cu) bonding, the peripheral circuit region PERI and the memory cell region CELL may be additionally joined by dielectric-dielectric bonding. The dielectric-dielectric bonding may be junction by dielectric layers respectively forming a portion of a peripheral region insulating layer 290 and a portion of a cell region insulating layer 190, and respectively surrounding the first bonding pads 298 and the second bonding pads 198. Therefore, the peripheral circuit region PERI and the memory cell region CELL may be joined without a separate adhesive layer.

FIGS. 7A to 17B are schematic cross-sectional views and partially enlarged plan views of stages in a method of manufacturing a semiconductor device according to example embodiments. FIGS. 7A, 8A, 9A, 10A, 11A, 12A, 13A, 14A, 15A, 16A, and 17A illustrate a cross-section corresponding to FIG. 2B, and FIGS. 7B, 8B, 9B, 10B, 11B, 12B, 13B, 14B, 15B, 16B, and 17B illustrate a cross-section corresponding to FIG. 2C, and FIGS. 9C, 9D, 11C, 11D, and 16C illustrate a plan view of a region corresponding to a lower separation region GC.

Figure 7A:
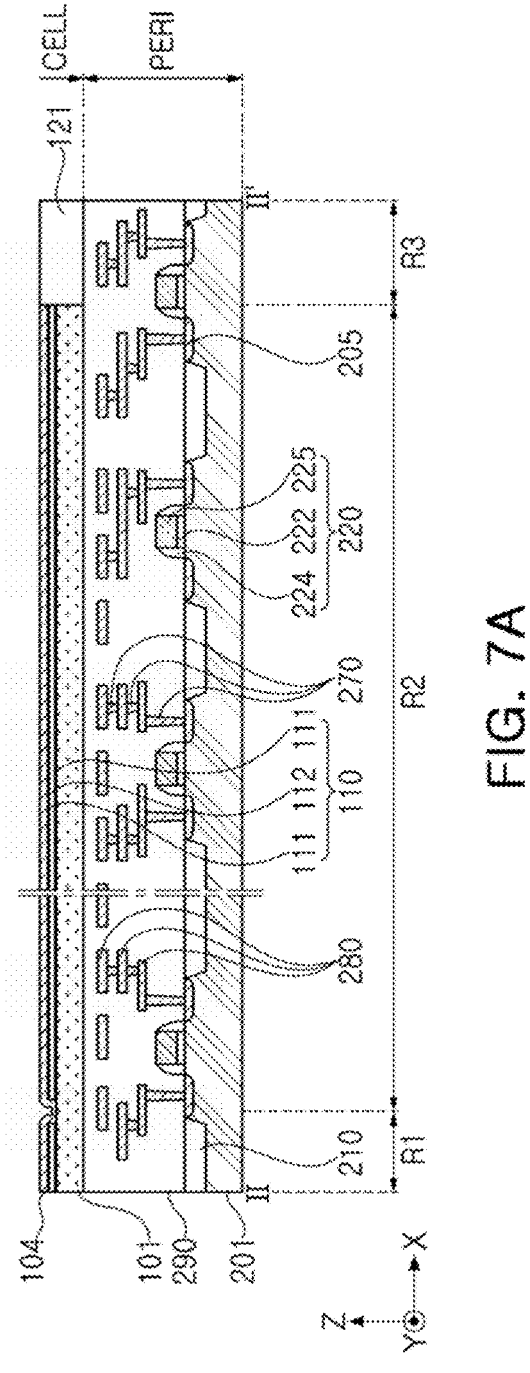
FIGS. 7A to 17B are schematic cross-sectional views and partially enlarged plan views of stages in a method of manufacturing a semiconductor device according to example embodiments.
Figure 7B:
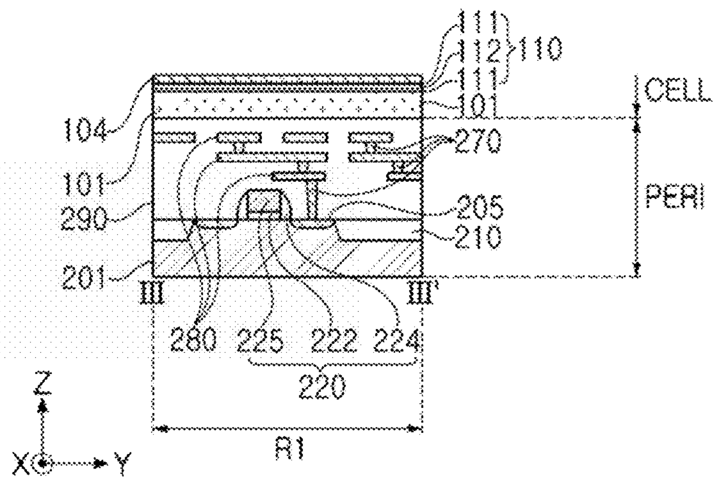

Referring to FIGS. 7A and 7B, a peripheral circuit region PERI including circuit devices 220 and circuit wiring structures may be formed on a first substrate 201, and a second substrate 101, a horizontal insulating layer 110, a second horizontal conductive layer 104, and a substrate insulating layer 121, in which a memory cell region CELL is provided on the peripheral circuit region PERI, may be formed.

First, device separation layers 210 may be formed in a first substrate 201, and a circuit gate dielectric layer 222 and a circuit gate electrode 225 may be sequentially formed on the first substrate 201. The device separation layers 210 may be formed in, e.g., a shallow trench separation (STI) process. The circuit gate dielectric layer 222 and the circuit gate electrode 225 may be formed using atomic layer deposition (ALD) or chemical vapor deposition (CVD). In an implementation, the circuit gate dielectric layer 222 may be formed of silicon oxide, and the circuit gate electrode 225 may be formed of polycrystalline silicon or metal silicide. Next, a spacer layer 224 and source/drain regions 205 may be formed on both sidewalls of the circuit gate dielectric layer 222 and the circuit gate electrode 225. In an implementation, the spacer layer 224 may include a plurality of layers. Next, an ion implantation process may be performed to form the source/drain regions 205.

Among circuit wiring structures, circuit contact plugs 270 may be formed by partially forming a peripheral region insulating layer 290, etching and removing a portion thereof, and then filling a conductive material. Circuit wiring lines 280 may be formed by, e.g., depositing a conductive material and then patterning the same.

The peripheral region insulating layer 290 may include a plurality of insulating layers. The peripheral region insulating layer 290 may be partially formed in a respective operation of forming the circuit wiring structures, and may be partially formed on an uppermost circuit wiring line 280. Finally, the peripheral region insulating layer 290 may be formed to cover circuit devices 220 and the circuit wiring structures.

Next, a second substrate 101 may be formed on the peripheral region insulating layer 290. The second substrate 101 may be formed of, e.g., polycrystalline silicon, and may be formed in a CVD process. Polycrystalline silicon constituting the second substrate 101 may include impurities.

First and second horizontal insulating layers 111 and 112 constituting a horizontal insulating layer 110 may be alternately stacked on the second substrate 101. The horizontal insulating layer 110 may a layer in which a portion thereof is partially replaced with the first horizontal conductive layer 102 of FIG. 2A in a subsequent process. The first horizontal insulating layers 111 may include a material different from that of the second horizontal insulating layer 112. In an implementation, the first horizontal insulating layers 111 may be formed of the same material as an interlayer insulating layers 120, and the second horizontal insulating layer 112 may be formed of the same material as a sacrificial layer 118 (refer to FIG. 14A). The horizontal insulating layer 110 may be partially removed by a patterning process in some regions, e.g., in a second region R2 of the second substrate 101.

A second horizontal conductive layer 104 may be formed on the horizontal insulating layer 110, and may be in contact with the second substrate 101 in a region from which the horizontal insulating layer 110 is removed. Therefore, the second horizontal conductive layer 104 may be bent along end portions of the horizontal insulating layer 110, may cover the end portions, and may extend onto the second substrate 101.

A substrate insulating layer 121 may be formed to pass through the second substrate 101 in a region including a region in which a through-via 175 (refer to FIG. 2A) will be. The substrate insulating layer 121 may be formed by removing a portion of the second substrate 101, a portion of the horizontal insulating layer 110, and a portion of the second horizontal conductive layer 104, and then burying an insulating material therein. After the insulating material is buried, a planarization process may further be performed using a chemical mechanical polishing (CMP) process. Therefore, an upper surface of the substrate insulating layer 121 may be substantially coplanar with an uppermost surface of the second horizontal conductive layer 104.

Figure 8A:
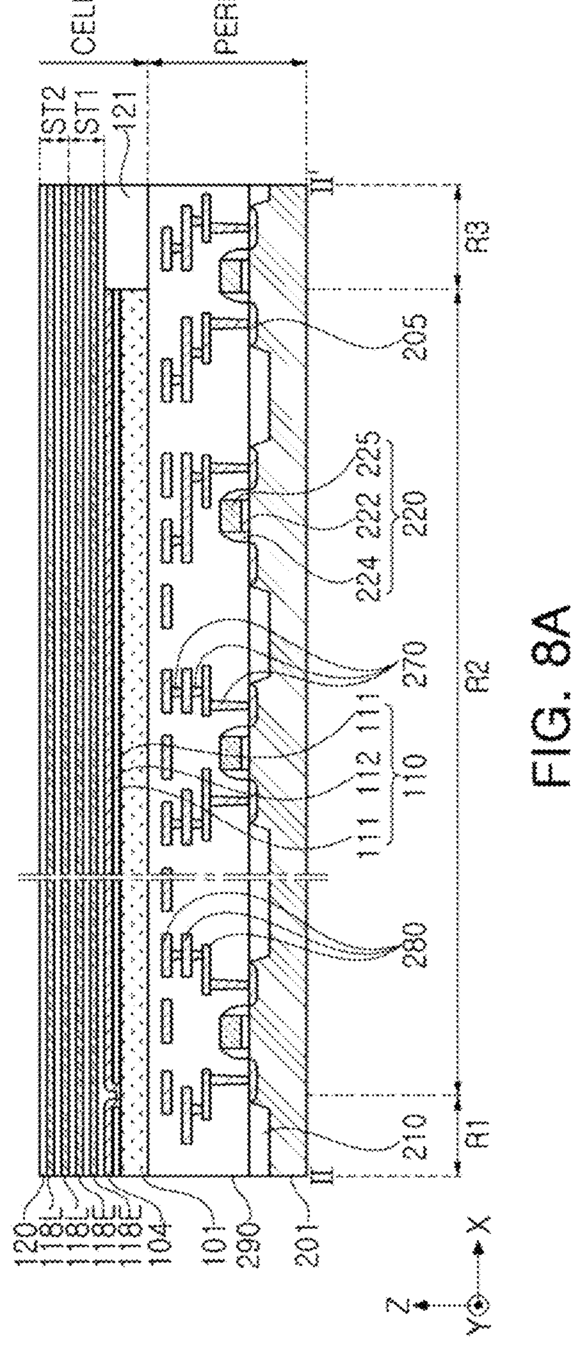
Figure 8B:
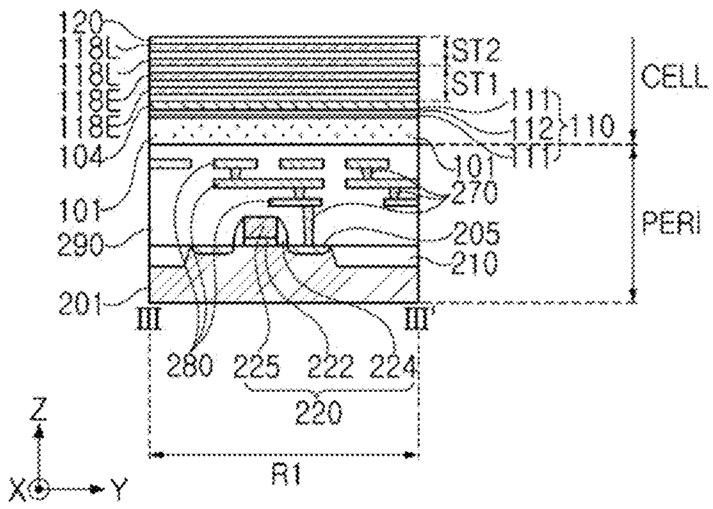

Referring to FIGS. 8A and 8B, interlayer insulating layers 120 and first sacrificial layers 118E may be alternately stacked on the second horizontal conductive layer 104 to form a first stack region ST1 of a stack structure, and the interlayer insulating layers 120 and second sacrificial layers 118L may be alternately stacked on the first stack region ST1 to form a second stack region ST2 of the stack structure.

The first sacrificial layers 118E may be replaced with erase gate electrodes 130E (see FIG. 2A) in a subsequent process, and the second sacrificial layers 118L may be replaced with lower gate electrodes 130L (see FIG. 2A) in a subsequent process. The first and second sacrificial layers 118E and 118L may be formed of a material different from that of the interlayer insulating layers 120. In an implementation, the interlayer insulating layer 120 may be formed silicon oxide or silicon nitride, and the first and second sacrificial layers 118E and 118L may be formed of silicon, silicon oxide, silicon carbide, or silicon nitride, and different from that of the interlayer insulating layer 120. In an implementation, thicknesses of the interlayer insulating layers 120 may not all be the same. In addition, thicknesses of the interlayer insulating layers 120 and the first and second sacrificial layers 118E and 118L, and the number of layers constituting them may be variously changed from those illustrated according to embodiments.

In an implementation, an uppermost portion of the second stack region ST2 may be formed of the second sacrificial layer 118L, instead of the interlayer insulating layer 120. In addition, an uppermost interlayer insulating layer 120 of the first stack region ST1 may be classified into the second stack region ST2, according to a description manner, the first and second stack regions ST1 and ST2 may be divided and explained in a different manner. In an implementation, the first and second stack regions ST1 and ST2 may be referred to as lower stack regions, and the first and second sacrificial layers 118E and 118L may be referred to as lower sacrificial layers.

Figure 9A:
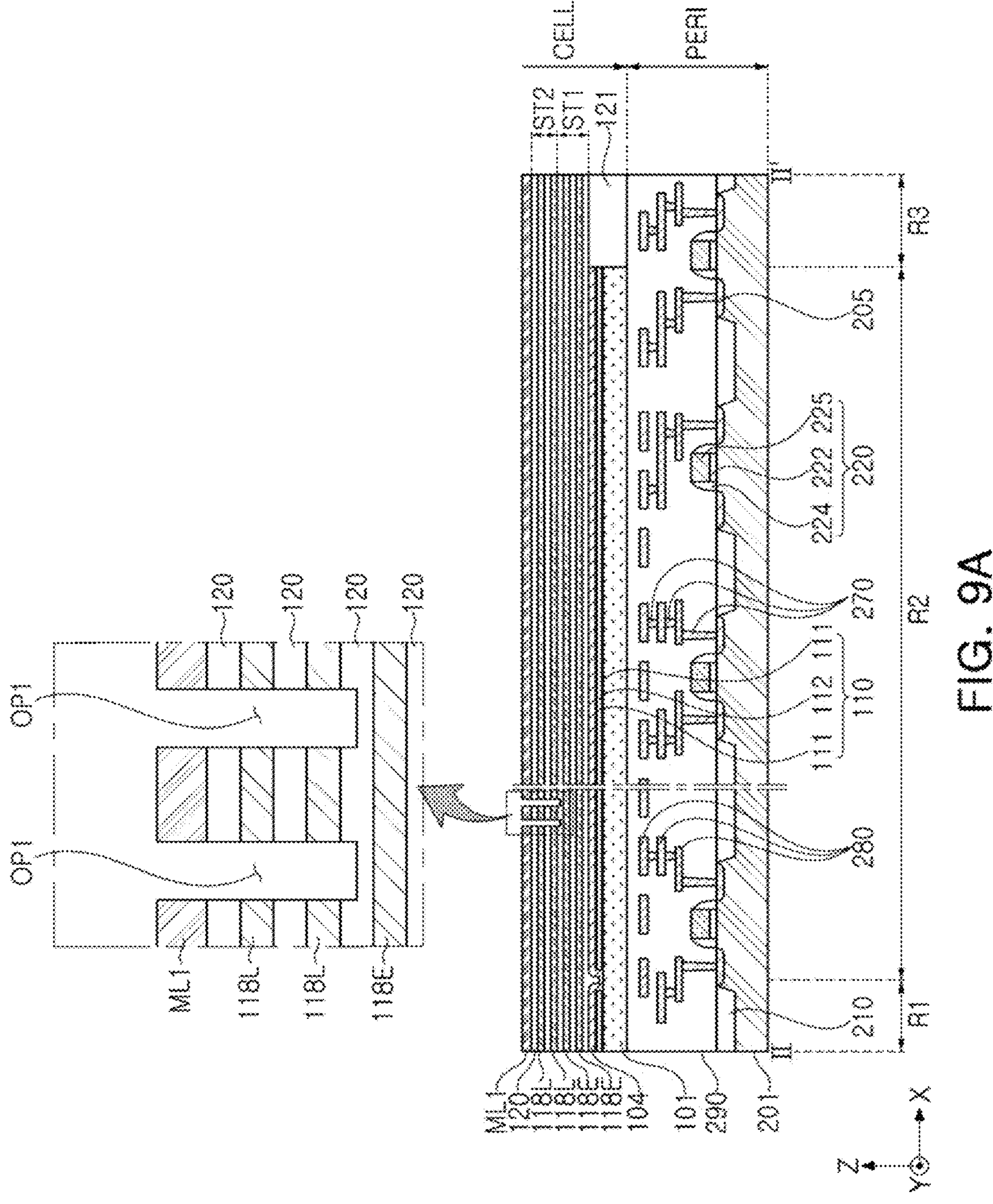
Figure 9B:
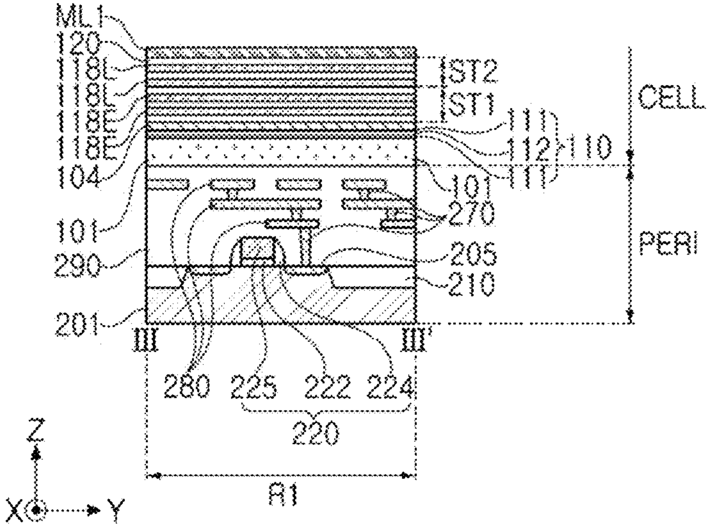

Referring to FIGS. 9A and 9B, a portion of the second stack region ST2 may be removed to form first openings OP1 spaced apart from each other in the X-direction.

Figure 9C:
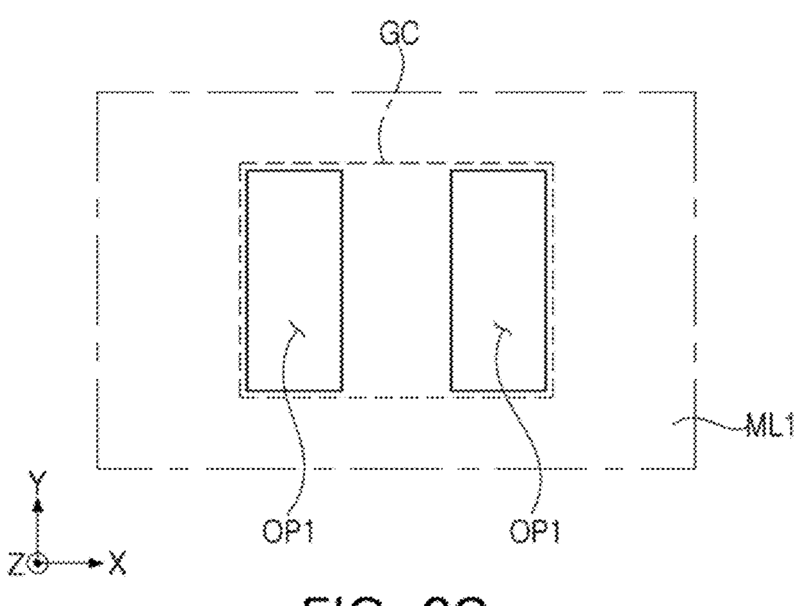

First, a first mask layer ML1 may be patterned in a photolithography process, and an etching process may be performed using the first mask layer ML1 to form first openings OP1. As illustrated in FIG. 9C, first openings OP1 may be formed to be spaced apart from each other in the X-direction in a region in which lower separation regions GC (refer to FIG. 1) are formed. The first openings OP1 may be formed to be located on both sides of a lower separation region GC in the X-direction. The first openings OP1 may be designed to have a rectangular pattern, and may be implemented to have a rectangular shape, a rectangular shape with rounded corners, or an oval shape.

Figure 9D:
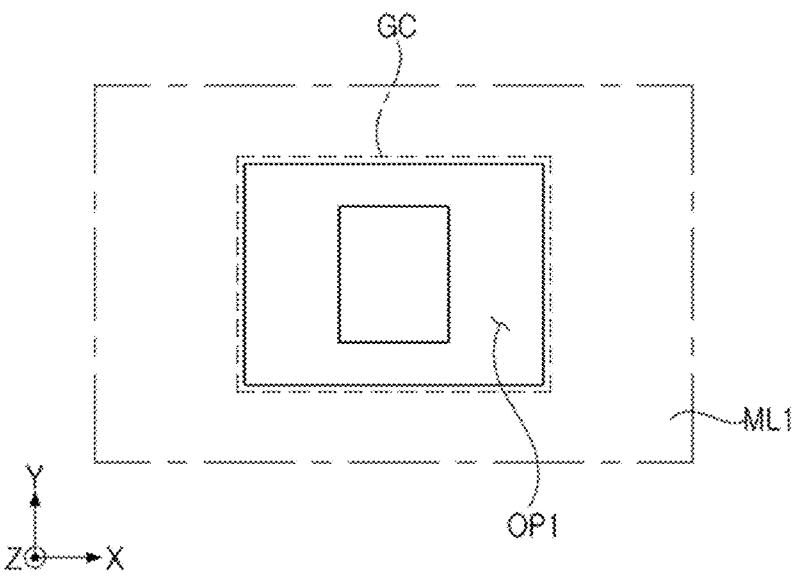

In an implementation, as illustrated in FIG. 9D, the first openings OP1 may be connected to each other at both sides of a lower separation region GC in the Y-direction, in a plan view. In an implementation, a first opening OP1 may have a rectangular ring (e.g., closed loop) shape, and may be a single opening in a lower separation region GC. In an implementation, when the lower separation region GC has a longer length in the Y-direction, the first openings OP1 may be formed to be on both sides of the lower separation region GC in the Y-direction. In an implementation, the first openings OP1 and a second opening OP2 (refer to FIG. 11C) to be subsequently formed to be rotated by 90 degrees.

As illustrated in the enlarged view in FIG. 9A, the first openings OP1 may extend in the Z-direction, may completely pass through the second sacrificial layers 118L, and may extend to have a level higher than an upper surface of the first sacrificial layer 118E (e.g., a level of a bottom of each first opening OP1 may be higher than a level of the upper surface of the first sacrificial layer 118E). The first openings OP1 may be formed to expose the interlayer insulating layer 120 below the second sacrificial layer 118L in a lower portion of the first openings OP1. In an implementation, the first openings OP1 may partially pass through the interlayer insulating layer 120 below the second sacrificial layer 118L in the lower portion.

In an implementation, the first openings OP1 may completely pass through the interlayer insulating layer 120 below the second sacrificial layer 118L in the lower portion. In an implementation, the first openings OP1 may be formed to completely pass through the interlayer insulating layer 120 below the second sacrificial layer 118L in the lower portion and partially recess or penetrate an upper portion of the first sacrificial layer 118E.

Figure 10A:
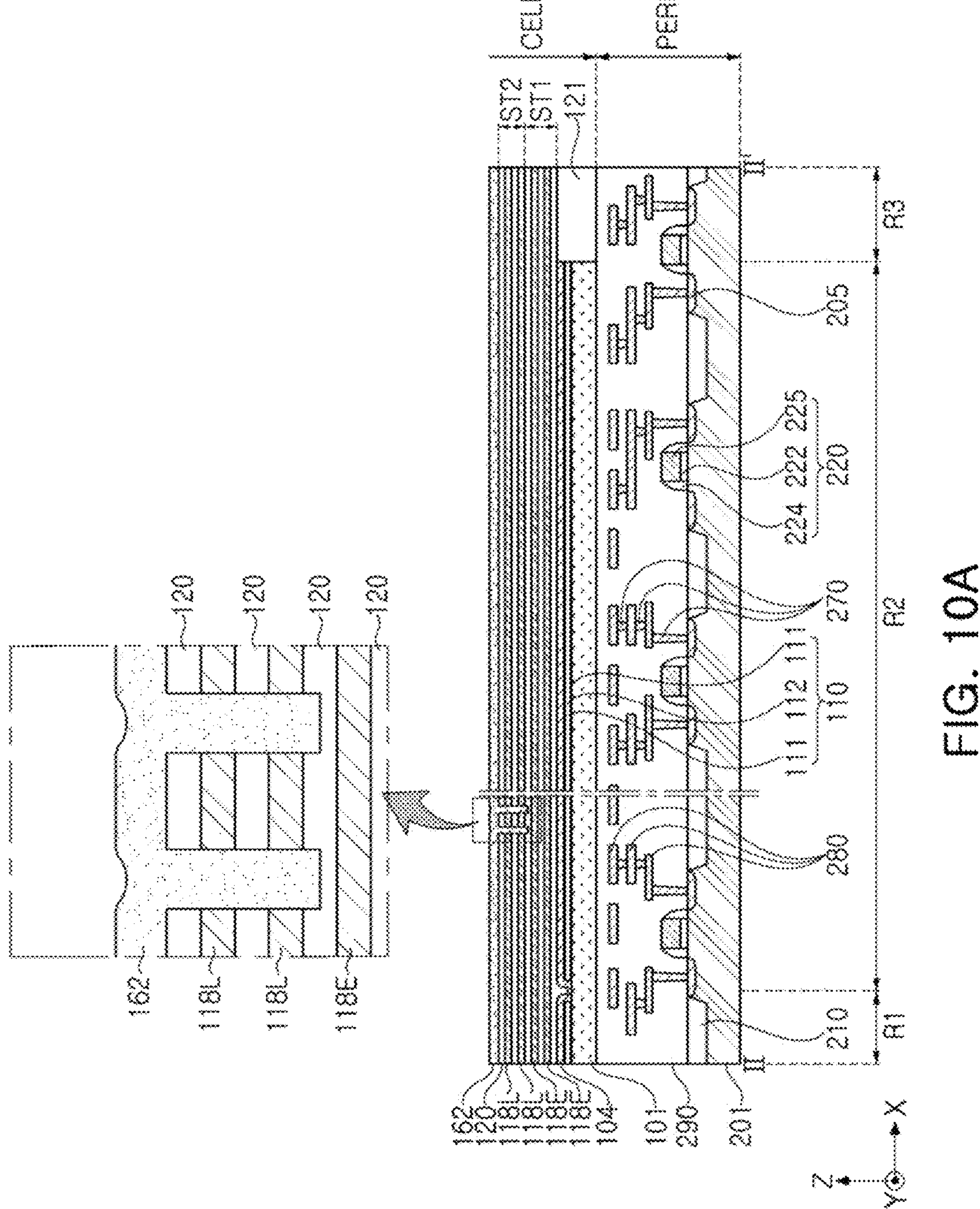
Figure 10B:
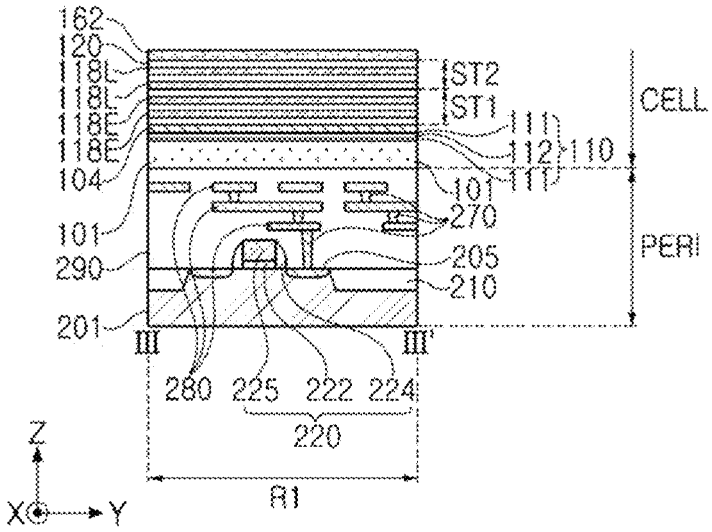

Referring to FIGS. 10A and 10B, a first filling insulating layer 162 filling the first openings OP1 may be formed.

The first filling insulating layer 162 may fill the first openings OP1, and may extend onto an upper surface of the second stack region ST2. The first filling insulating layer 162 may have depressions in an upper surface corresponding to the first openings OP1. A thickness of the first filling insulating layer 162 on the upper surface of the second stack region ST2 may be variously changed according to embodiments.

The first filling insulating layer 162 may include an insulating material, e.g., tetraethyl orthosilicate (TEOS) oxide, high density plasma (HDP) oxide, or the like. The first filling insulating layer 162 may be formed by, e.g., a CVD or PVD process. The first filling insulating layer 162 may include a material different from that of the second sacrificial layers 118L. In an implementation, the first filling insulating layer 162 may include, e.g., the same material as the interlayer insulating layers 120.

Referring to FIGS. 11A to 11D, a portion of the second stack region ST2 may be removed to form a second opening OP2.

First, a second mask layer ML2 may be patterned in a photolithography process, and an etching process may be performed using the second mask layer ML2 to form a second opening OP2. The second opening OP2 may be formed to pass through the second stack region ST2 in a central portion of the second stack region ST2 remaining between the first openings OP1 in the X-direction. As illustrated in FIG. 11C, a second opening OP2 may be formed between the first openings OP1 in the X-direction in a region in which lower separation regions GC (refer to FIG. 1) are formed. The second opening OP2 may be designed to have a rectangular pattern in a plan view, and may be implemented to have a rectangular shape, a rectangular shape with rounded corners, or an oval shape.

The second opening OP2 may have a shorter length in the X-direction and the Y-direction than the first openings OP1. In an implementation, a size of the second opening OP2 may be determined in consideration of a range of the second sacrificial layers 118L, in a plan view, that may be etched by an etchant introduced through the second opening OP2 in a subsequent process.

In an implementation, as illustrated in FIG. 11D, the second opening OP2 may be formed to have the same length as the first openings OP1 in the Y-direction. In this case, in a lower separation region GC, finally formed, a second filling insulating layer 164 (refer to FIG. 3A) may have a shape in which both ends thereof in the Y-direction protrude relatively convexly in a plan view.

Figure 11A:
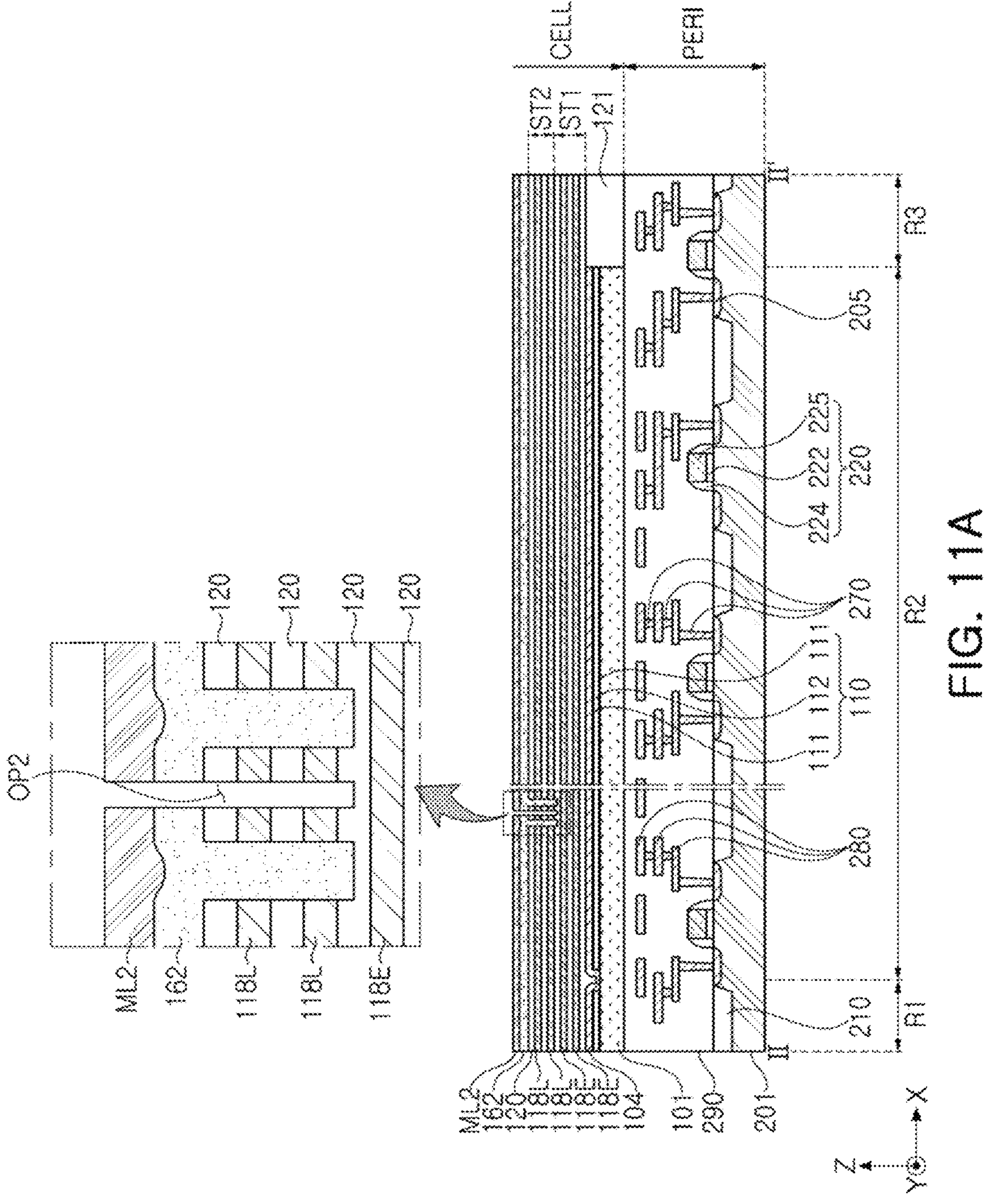
Figure 11B:
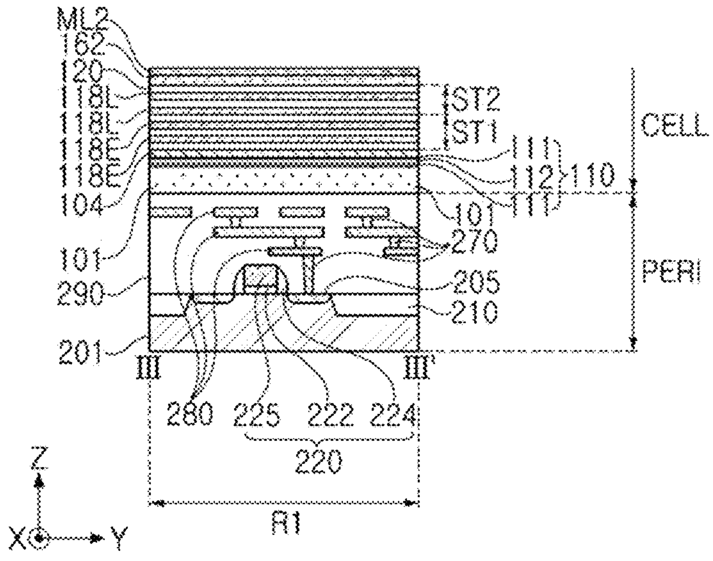
Figures 11C, 11D:
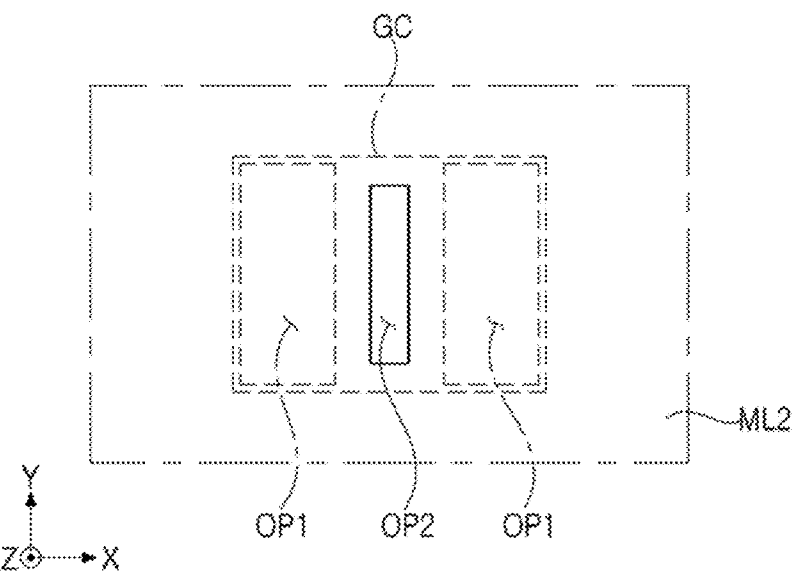

As illustrated in the enlarged view in FIG. 11A, the second opening OP2 may extend in the Z-direction to completely pass through the second sacrificial layers 118L, and may extend to a level higher than the upper surface of the first sacrificial layer 118E. The first openings OP1 may be formed to expose the interlayer insulating layer 120 below the second sacrificial layer 118L in the lower portion. In an implementation, a depth of the second opening OP2 may be substantially the same as a depth of the first opening OP1.

In an implementation, e.g., as illustrated in FIG. 5A, the second opening OP2 may be formed to completely pass through the interlayer insulating layer 120 below the second sacrificial layer 118L in the lower portion and partially recess the upper portion of the first sacrificial layer 118E.

Figure 12A:
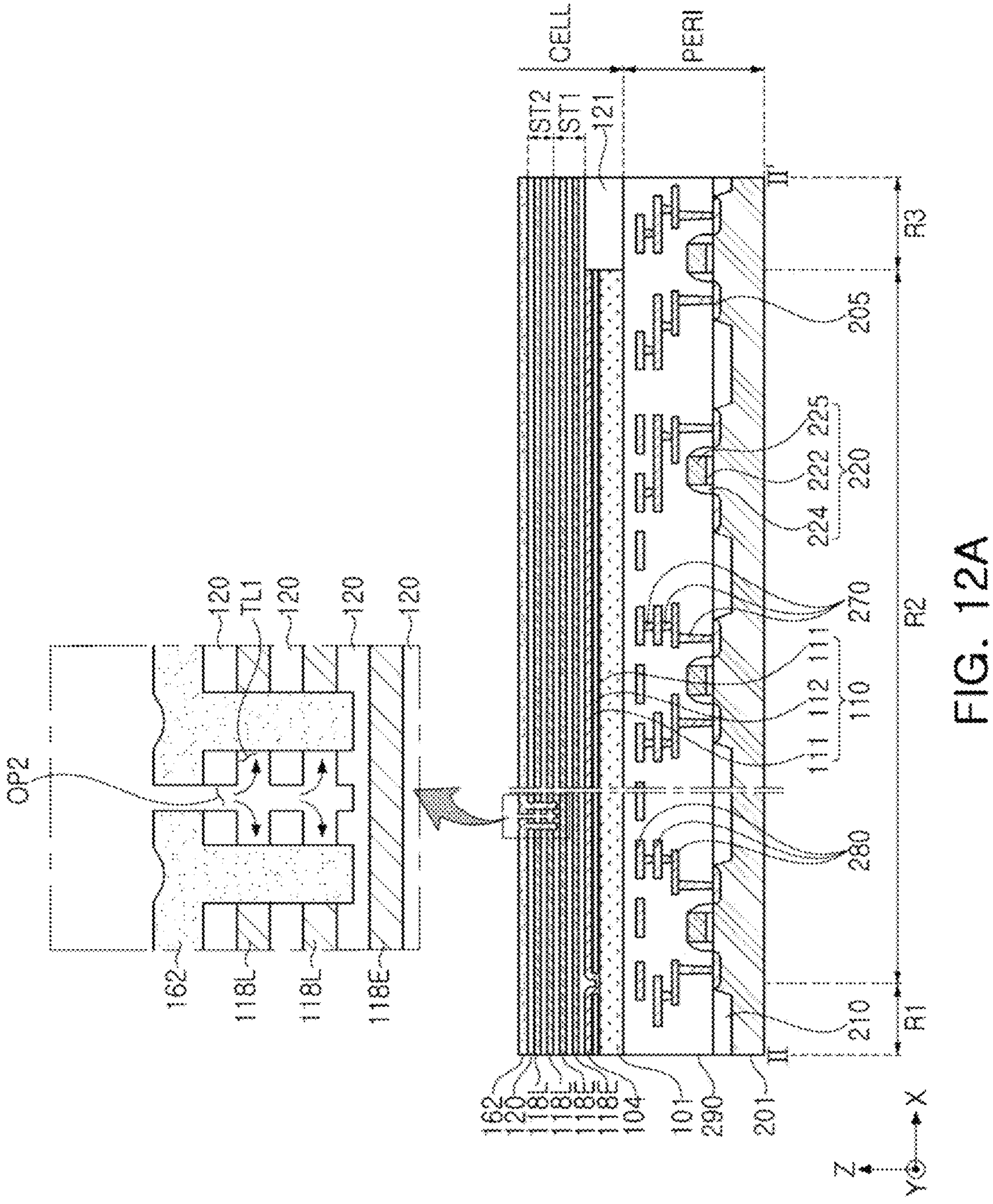
Figure 12B:
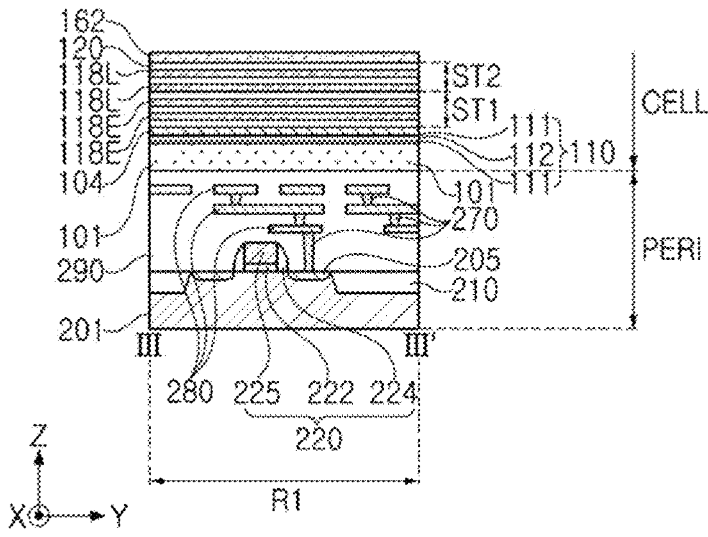

Referring to FIGS. 12A and 12B, portions of the second sacrificial layers 118L exposed through the second opening OP2 may be removed.

The second sacrificial layers 118L may be selectively removed with respect to the interlayer insulating layers 120 and the first filling insulating layer 162 by, e.g., a wet etching process. Therefore, first tunnel portions TL1 extending horizontally from the second opening OP2 may be formed. The first filling insulating layers 162 may be exposed through end portions of the first tunnel portions TL1.

Figure 13A:
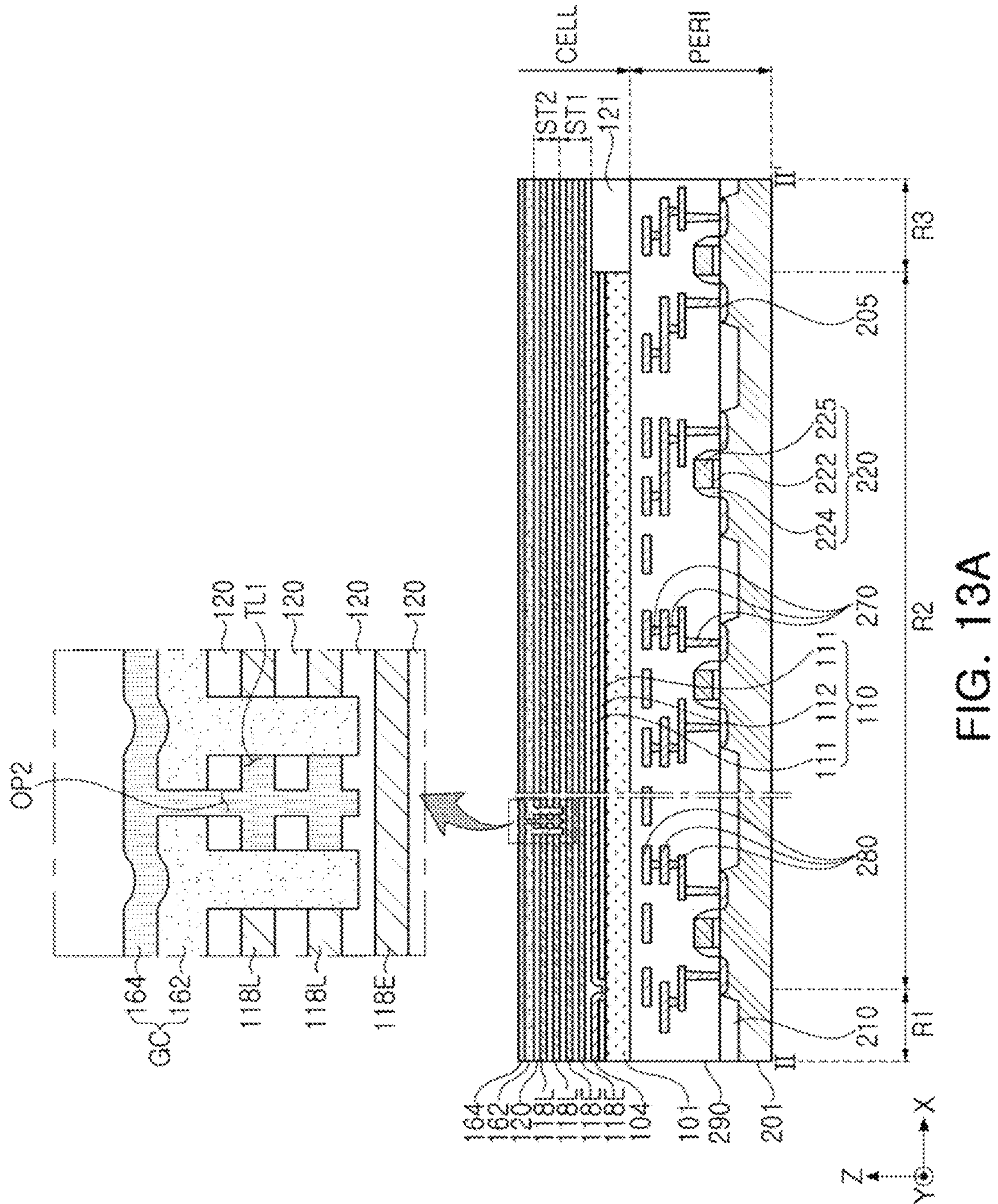
Figure 13B:
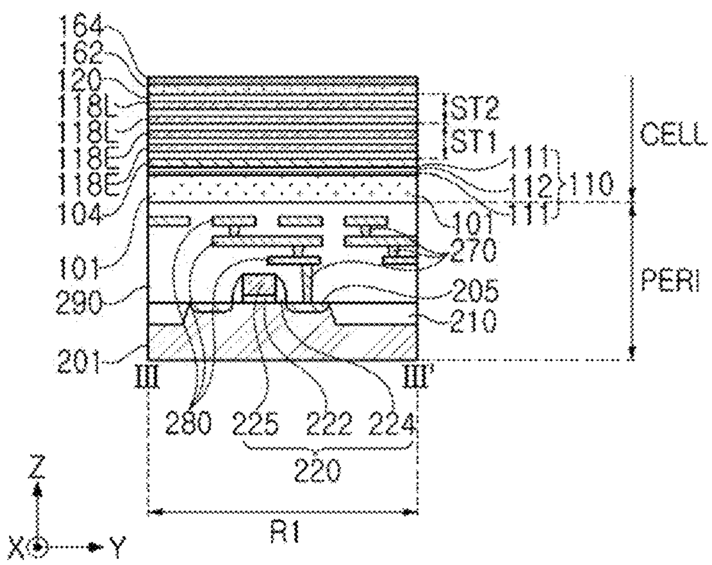

Referring to FIGS. 13A and 13B, a second filling insulating layer 164 filling the second opening OP2 and the first tunnel portions TL1 may be formed.

The second filling insulating layer 164 may fill the first tunnel portions TL1 and the second opening OP2, and may extend onto upper surfaces of the first filling insulating layers 162. The second filling insulating layer 164 may be formed to prepare a lower separation region GC including the first and second filling insulating layers 162 and 164, in a region from which the second sacrificial layers 118L have been removed.

The second filling insulating layer 164 may fill the depressions in the upper surface of the first filling insulating layer 162. A thickness of the second filling insulating layer 164 on the upper surface of the first filling insulating layer 162 may be variously changed according to embodiments. The second filling insulating layer 164 may be formed by a different deposition method from the first filling insulating layers 162. The second filling insulating layer 164 may be formed by, e.g., an ALD process.

The second filling insulating layer 164 may include an insulating material, e.g., silicon oxide or silicon oxynitride, and may further include impurities. In an implementation, the second filling insulating layer 164 may include, e.g., the same material as the interlayer insulating layers 120 and the first filling insulating layer 162.

In an implementation, after forming the first openings OP1 and forming the first filling insulating layers 162, the second opening OP2 and the second filling insulating layer 164 may be formed to prepare the lower separation region GC, without forming the lower separation region GC by a single photolithography process and an etching process. Therefore, no depression may be formed in a central portion of the lower separation region GC having a relatively long length in the X-direction.

Figure 14A:
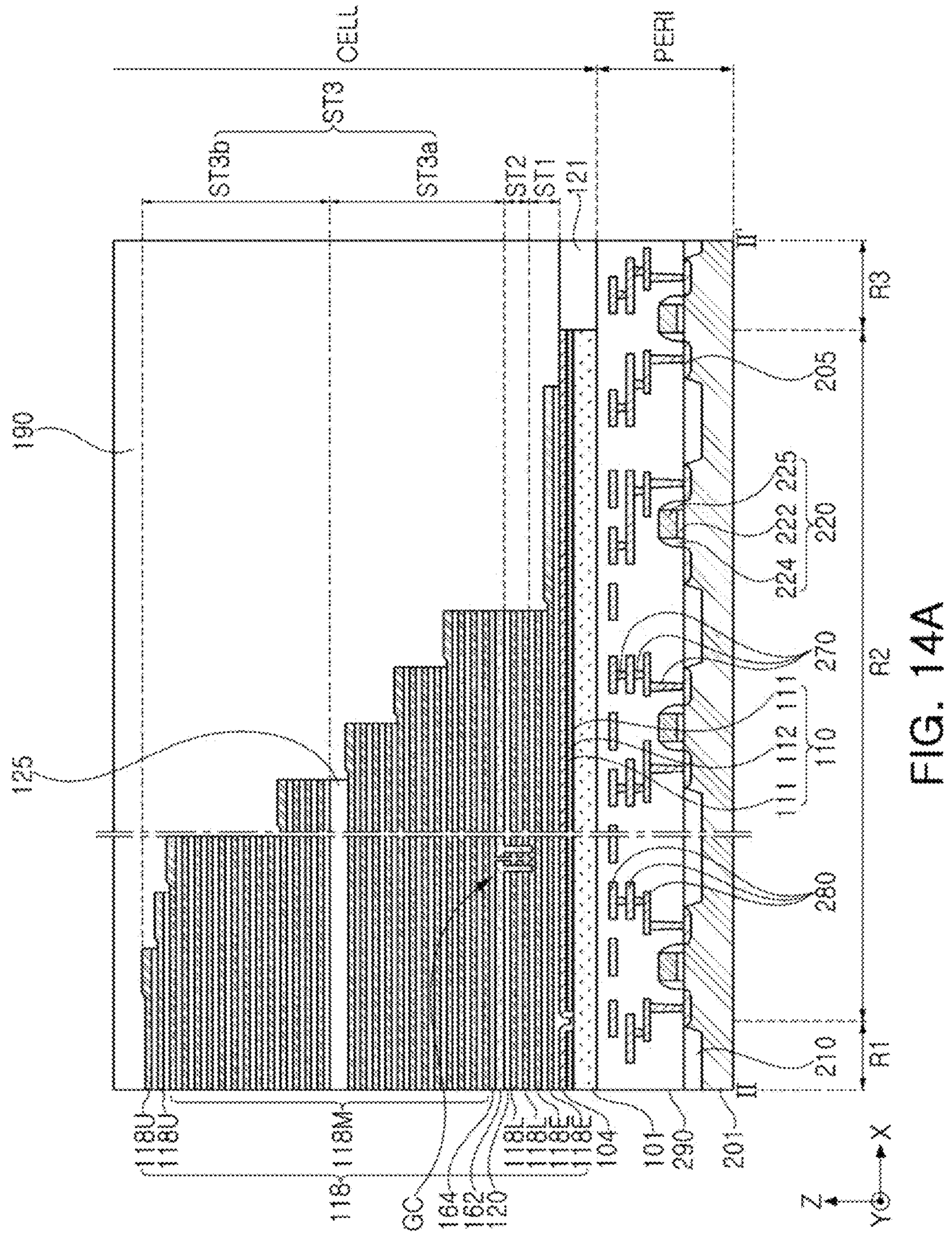
Figure 14B:
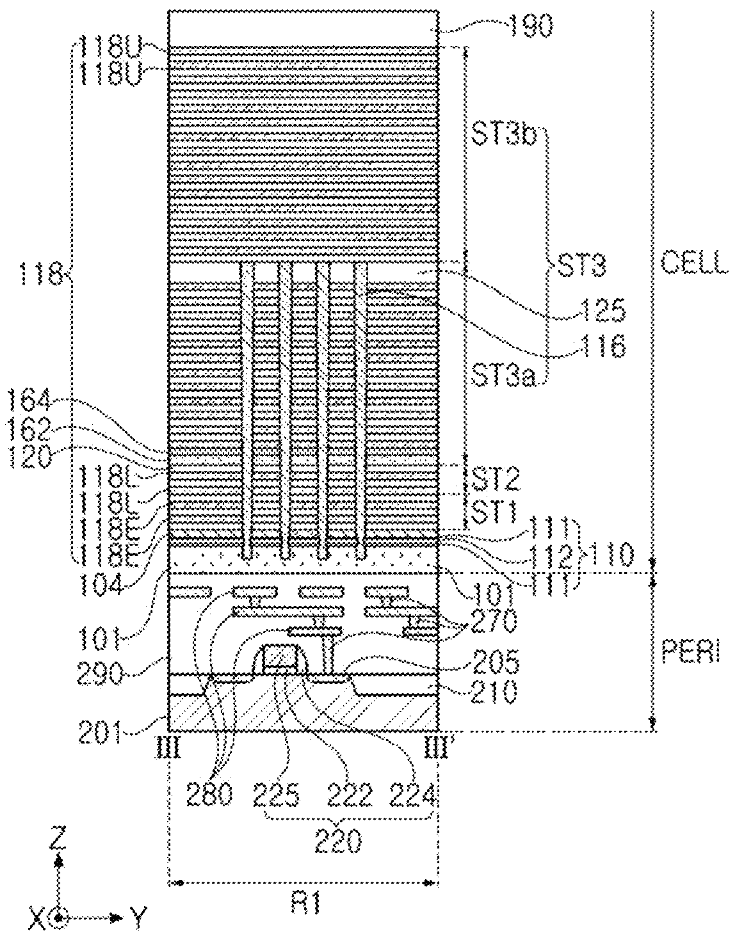

Referring to FIGS. 14A and 14B, an upper surface of the second filling insulating layer 164 may be planarized, and a third stack region ST3 of the stack structure may be formed on the second filling insulating layer 164.

First, an upper surface of the second filling insulating layer 164 may be planarized by a CMP process or the like. Therefore, the second filling insulating layer 164 may not have depressions in the upper surface. Next, the interlayer insulating layers 120 and third and fourth sacrificial layers 118M and 118U may be alternately stacked to form a third stack region ST3. A lowermost third sacrificial layer 118M may have a substantially planar lower surface, and thus the third and fourth sacrificial layers 118M and 118U may have substantially planar lower surfaces. In an implementation, the third stack region ST3 may be referred to as an upper stack region, and the third and fourth sacrificial layers 118M and 118U may be referred to as upper sacrificial layers.

Lower channel sacrificial layers 116 may be formed in a process of forming the third stack region ST3. After a lower region ST3*a* of the third stack region ST3 is formed, the lower channel sacrificial layers 116 may be formed to pass through the first stack region ST1, the second stack region ST2, and the lower region ST3*a* of the third stack region ST3 and extend to the second substrate 101. The lower channel sacrificial layers 116 may be formed in a region corresponding to first channel structures CH1 (refer to FIG. 2C). In addition, the lower channel sacrificial layers 116 may further be formed in a region corresponding to support structures DCH (refer to FIG. 1). The lower channel sacrificial layers 116 may include, e.g., polycrystalline silicon.

Next, in the second region R2, photolithography and etching processes for sacrificial layers 118 may be repeated using a mask layer such that sacrificial layers 118 in the upper portion extend shorter than sacrificial layers 118 in the lower portion. Therefore, the sacrificial layers 118 may form a stepped structure in a predetermined unit. Next, the sacrificial layers 118 on the stepped structure may further be formed, to thickly form a sacrificial layer located in an uppermost portion in each region. The formation of the stepped structure may be performed on a lower region ST3*a* and an upper region ST3*b* of the third stack region ST3, respectively, or may be performed simultaneously.

Next, a portion of a cell region insulating layer 190 covering the stack structure of the sacrificial layers 118 and the interlayer insulating layers 120 may be formed. Next, upper channel sacrificial layers passing through the upper region ST3*b* of the third stack region ST3 and connected to the lower channel sacrificial layers 116 may further be formed.

Figure 15A:
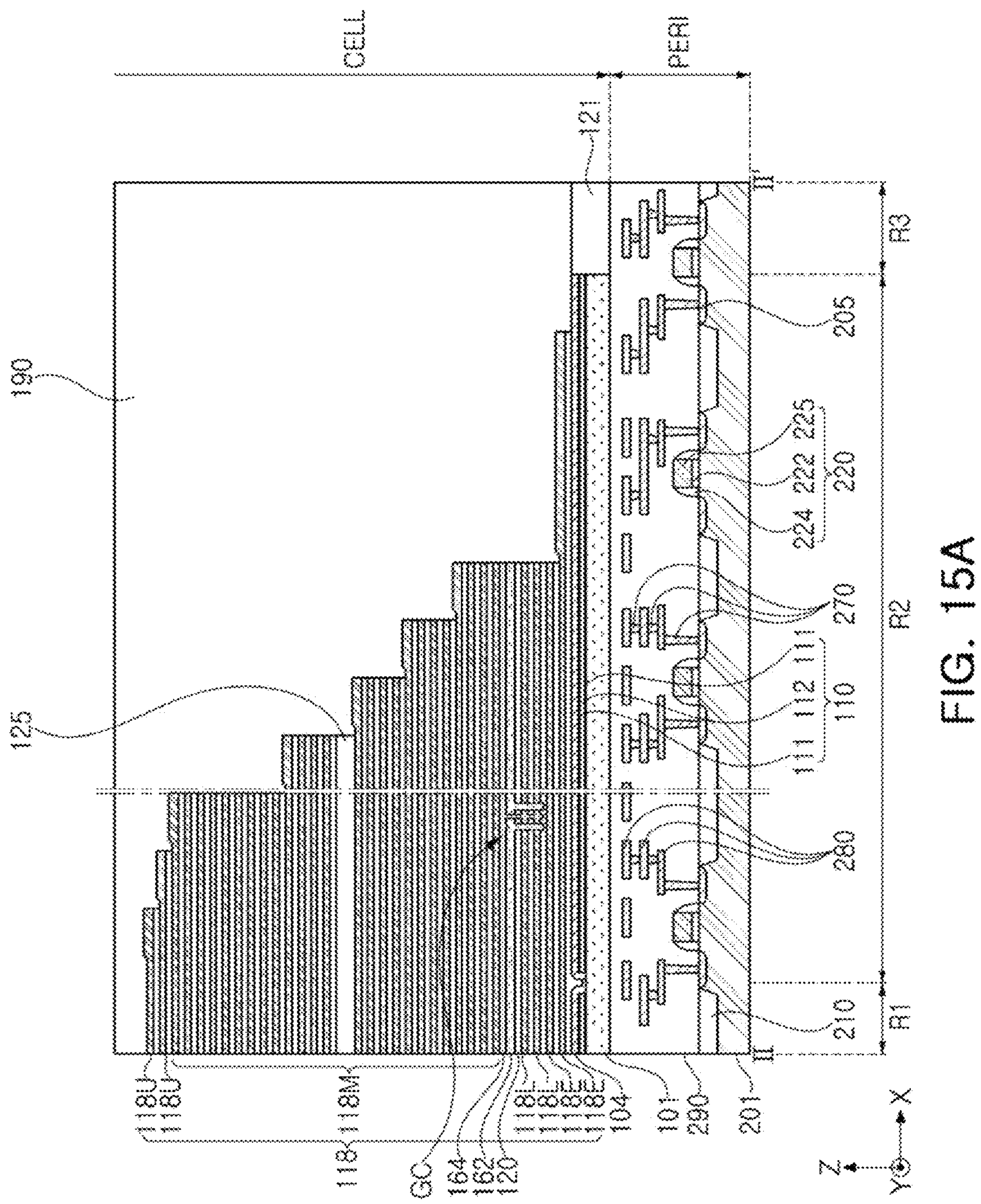
Figure 15B:
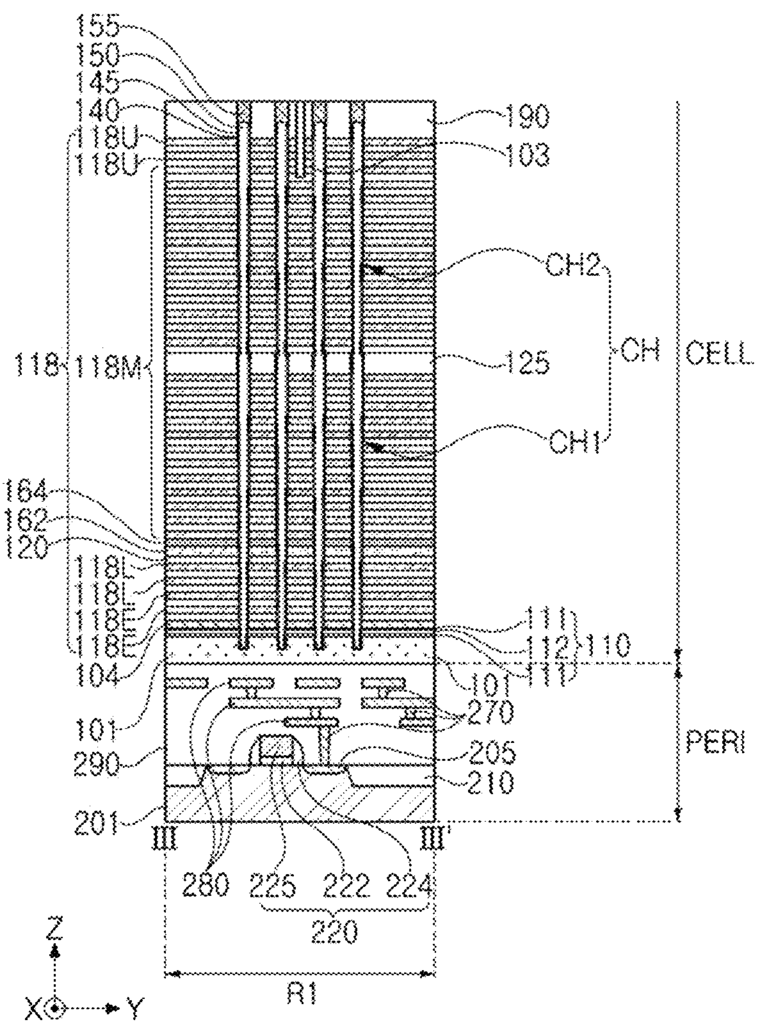

Referring to FIGS. 15A and 15B, channel structures CH passing through the stack structure may be formed.

First, as illustrated in FIG. 15B, a portion of sacrificial layers 118 including the fourth sacrificial layers 118U and a portion of the interlayer insulating layers 120 may be removed to form an upper separation region SS. To form the upper separation region SS, a region in which the upper separation region SS is to be formed may be exposed using a separate mask layer, and a predetermined number of sacrificial layers 118 and a predetermined number of interlayer insulating layers 120 may be removed from an uppermost portion, and an insulating material may be deposited to form the upper separation insulating layer 103.

Next, the lower channel sacrificial layers 116 and the upper channel sacrificial layers may be removed to form channel holes, and the channel holes may be buried to form channel structures CH. In an implementation, a gate dielectric layer 145, a channel layer 140, a channel buried insulating layer 150, and channel pads 155 may be sequentially formed in the channel holes to form channel structures CH. The channel layer 140 may be formed on the gate dielectric layer 145 in the channel structures CH. The channel buried insulating layer 150 may be formed to fill the channel structures CH, and may be an insulating material. In an implementation, a space in the channel layer 140 may be filled with a conductive material, instead of the channel buried insulating layer 150. The channel pads 155 may be formed of a conductive material, e.g., polycrystalline silicon.

After forming the channel structures CH, support structures DCH (refer to FIG. 1) may be also formed in a similar manner. In an implementation, the lower channel sacrificial layers 116 and the upper channel sacrificial layers may be removed to form support holes, and the support holes may be filled with an insulating material, to form support structures DCH.

Figure 16A:
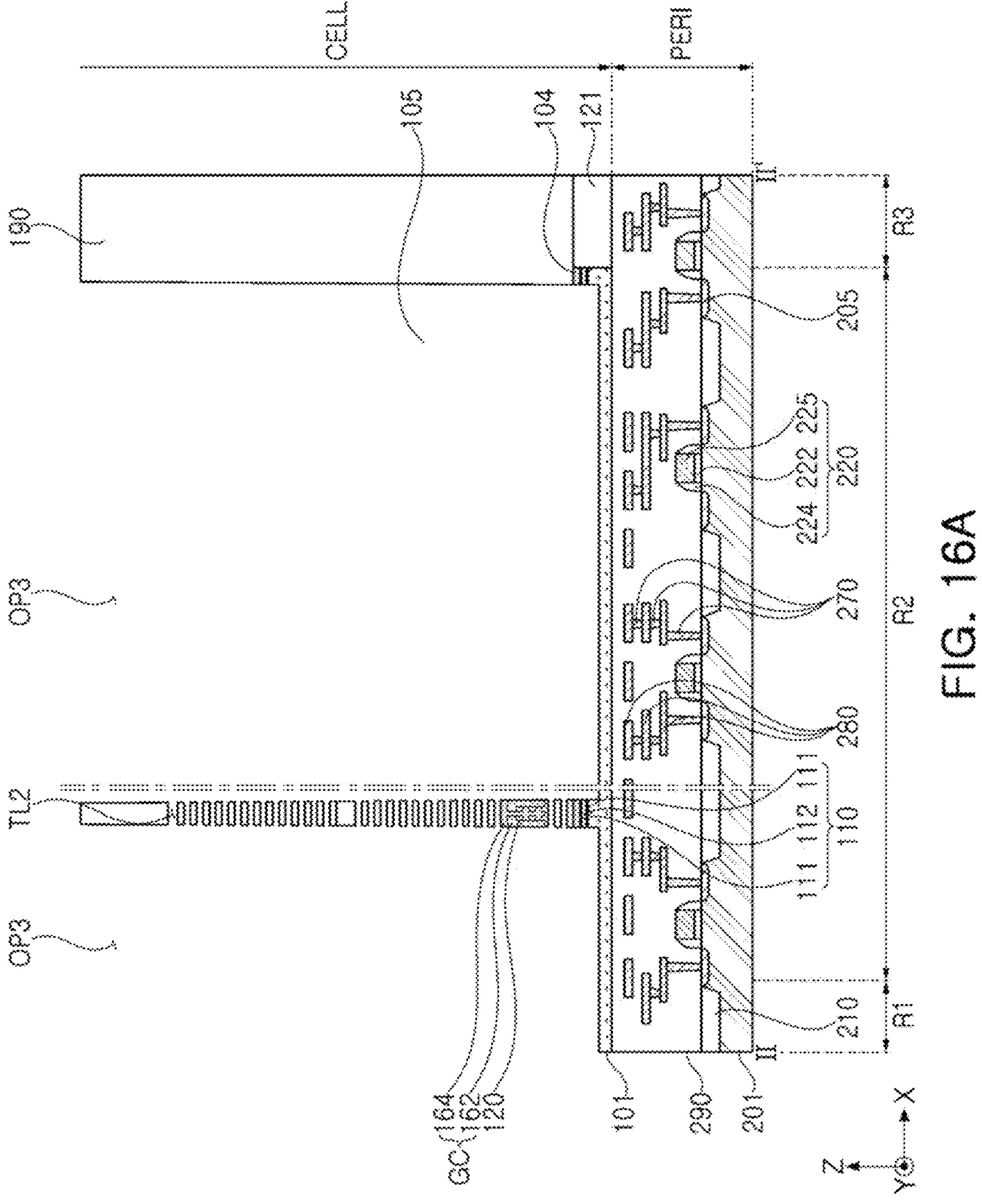
Figure 16B:
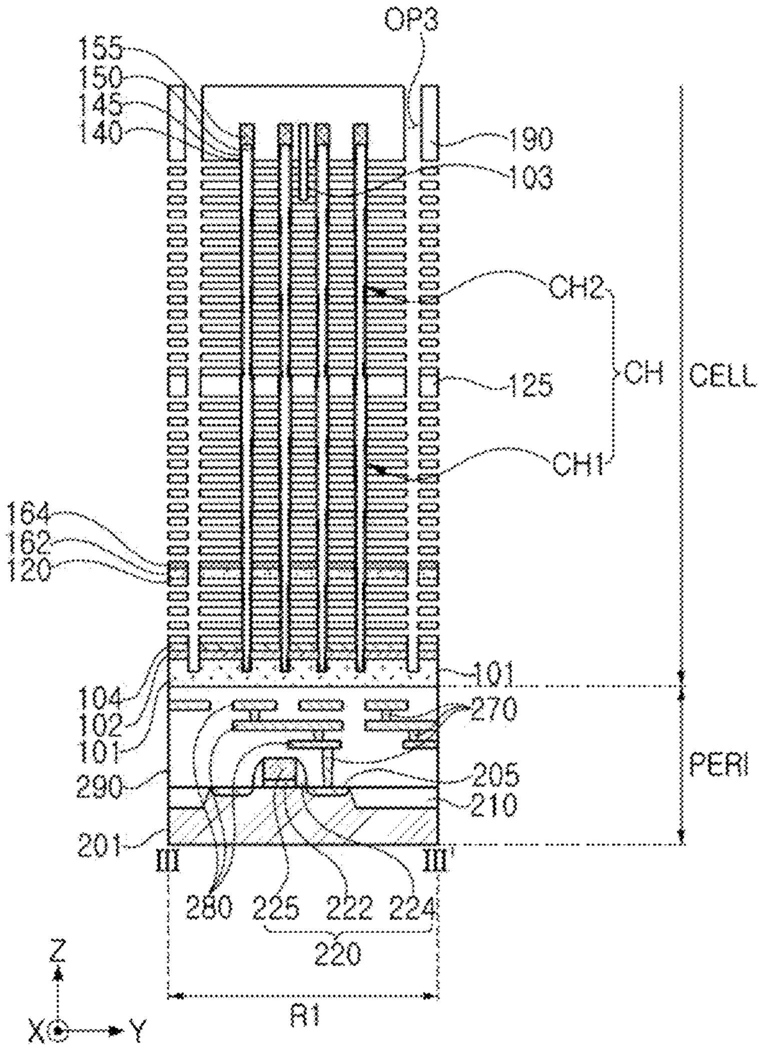
Figure 16C:
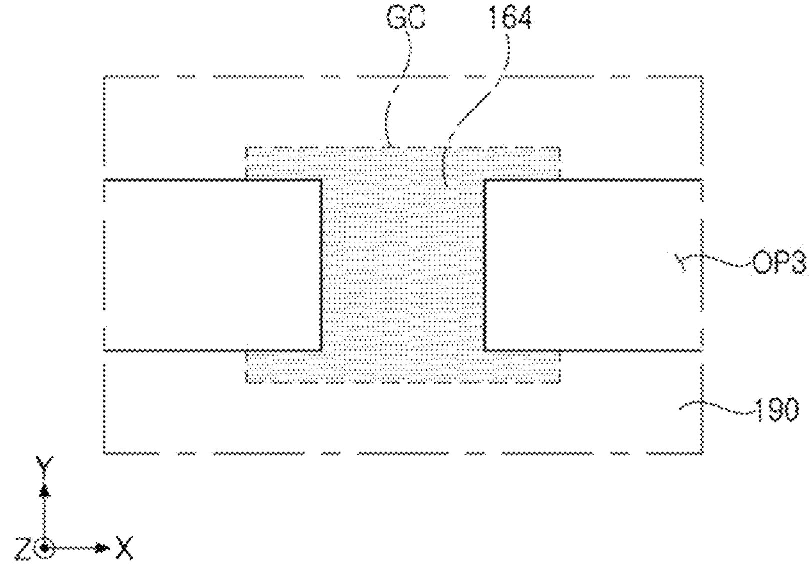

Referring to FIGS. 16A to 16C, third openings OP3 passing through the stack structure and extending to the second substrate 101 may be formed, a first horizontal conductive layer 102 may be formed, and the sacrificial layers 118 may be removed through the third openings OP3 to form second tunnel portions TL2.

First, a cell region insulating layer 190 may further be formed, and third openings OP3 may be formed at positions corresponding to first and second separation regions MS1, MS2*a*, and MS2*b* (see FIG. 1). The third openings OP3 may be formed to have a trench shape extending in the X-direction. As illustrated in FIG. 16C, in a region including the lower separation region GC, the third openings OP3 may be spaced apart from each other in the X-direction with the lower separation region GC therebetween. The third openings OP3 may be formed to pass through a portion of the lower separation region GC on both sides of the lower separation region GC in the X-direction. Therefore, the first and second filling insulating layers 162 and 164 of the lower separation region GC may be exposed through a portion of the third openings OP3. In an implementation, the third openings OP3 may be formed to contact the lower separation region GC, without passing through the lower separation region GC, to expose the first and second filling insulating layers 162 and 164.

Next, the horizontal insulating layer 110 may be partially removed. The second horizontal insulating layer 112 may be exposed by an etch-back process while forming separate sacrificial spacer layers in the third openings OP3. The exposed second horizontal insulating layer 112 may be selectively removed, and then the first horizontal insulating layers 111 below and above the exposed second horizontal insulating layer 112 may be removed. The horizontal insulating layer 110 may be removed by, e.g., a wet etching process. In a process of removing the first horizontal insulating layers 111, a portion of the gate dielectric layer 145 exposed in a region in which the second horizontal insulating layer 112 is removed may also be removed together. After the first horizontal conductive layer 102 is formed by depositing a conductive material in a region in which the horizontal insulating layer 110 has been removed, the sacrificial spacer layers may be removed in the third openings OP3. Through this process, the first horizontal conductive layer 102 may be formed in the first region R1, and the horizontal insulating layer 110 may remain in the second region R2.

Next, the sacrificial layers 118 may be, e.g., selectively removed with respect to the interlayer insulating layers 120 and the first and second filling insulating layers 162 and 164 using wet etching. Therefore, second tunnel portions TL2 may be formed between the interlayer insulating layers 120.

Figure 17A:
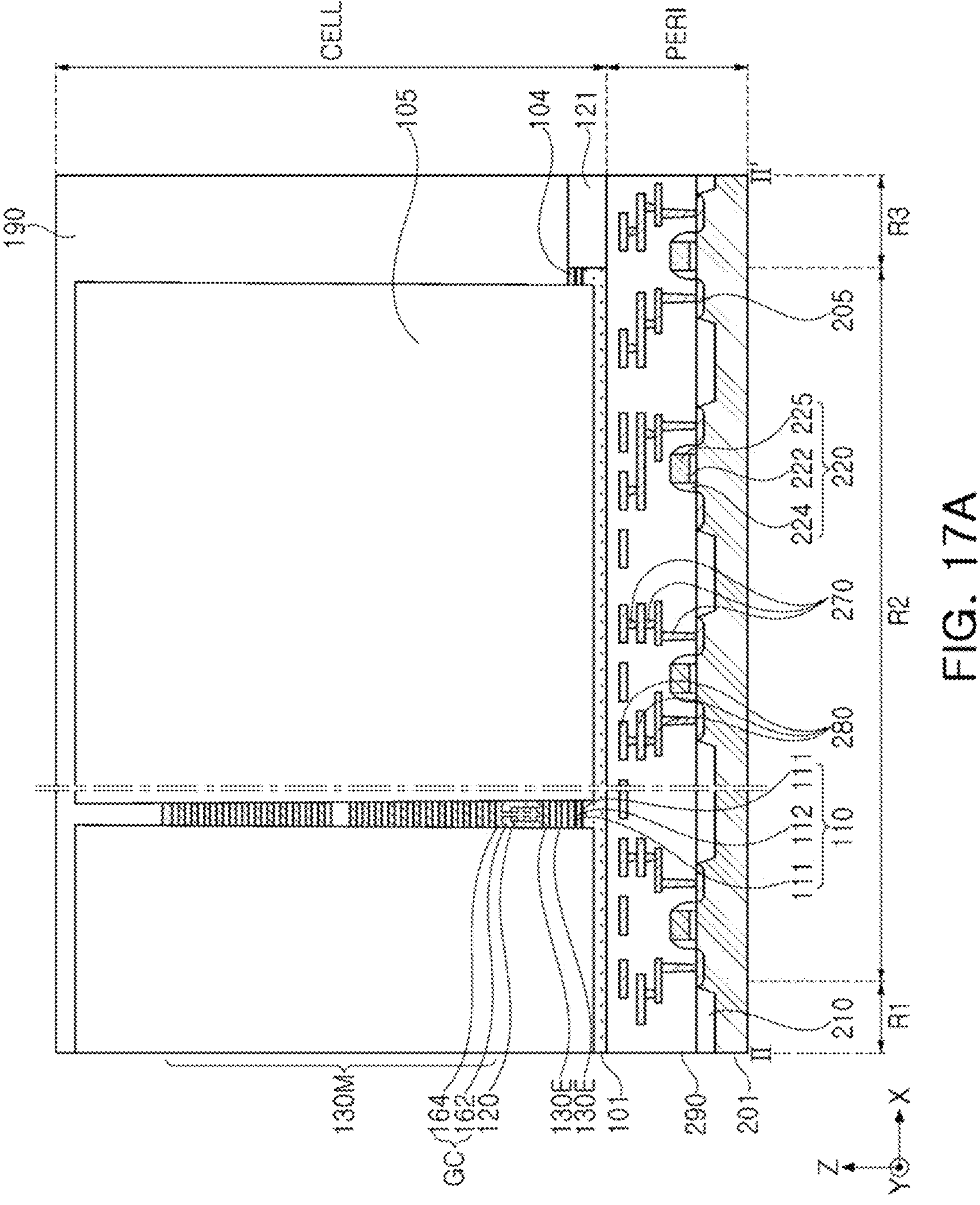
Figure 17B:
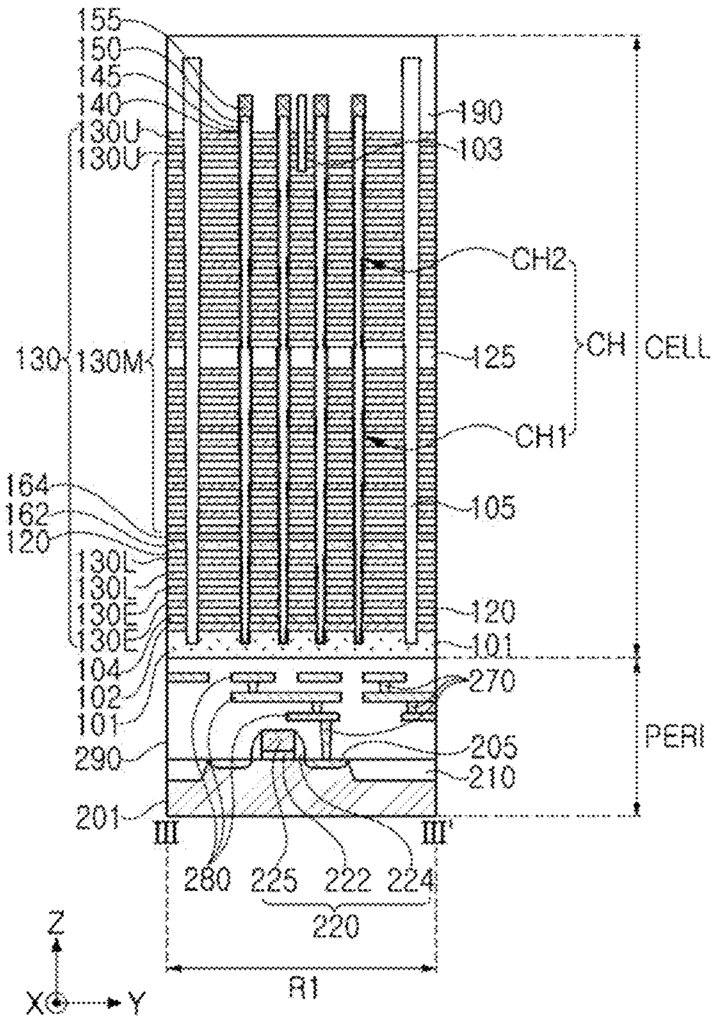

Referring to FIGS. 17A and 17B, gate electrodes 130 may be formed in the second tunnel portions TL2, and separation insulating layers 105 may be formed in the third openings OP3.

When a portion of the gate dielectric layer 145 extends horizontally along the gate electrodes 130, a portion of the gate dielectric layer 145 may be formed before the gate electrodes 130 in this operation. A conductive material of the gate electrodes 130 may include, e.g., metal, polycrystalline silicon, or a metal silicide material.

After forming the gate electrodes 130, an insulating material may be filled in the third openings OP3 to form the separation insulating layers 105.

Next, referring to FIGS. 2A to 2D together, contact plugs 170 connected to the gate electrodes 130 may be formed and upper contact plugs 180 may further be formed, to manufacture a semiconductor device 100.

Figure 18:
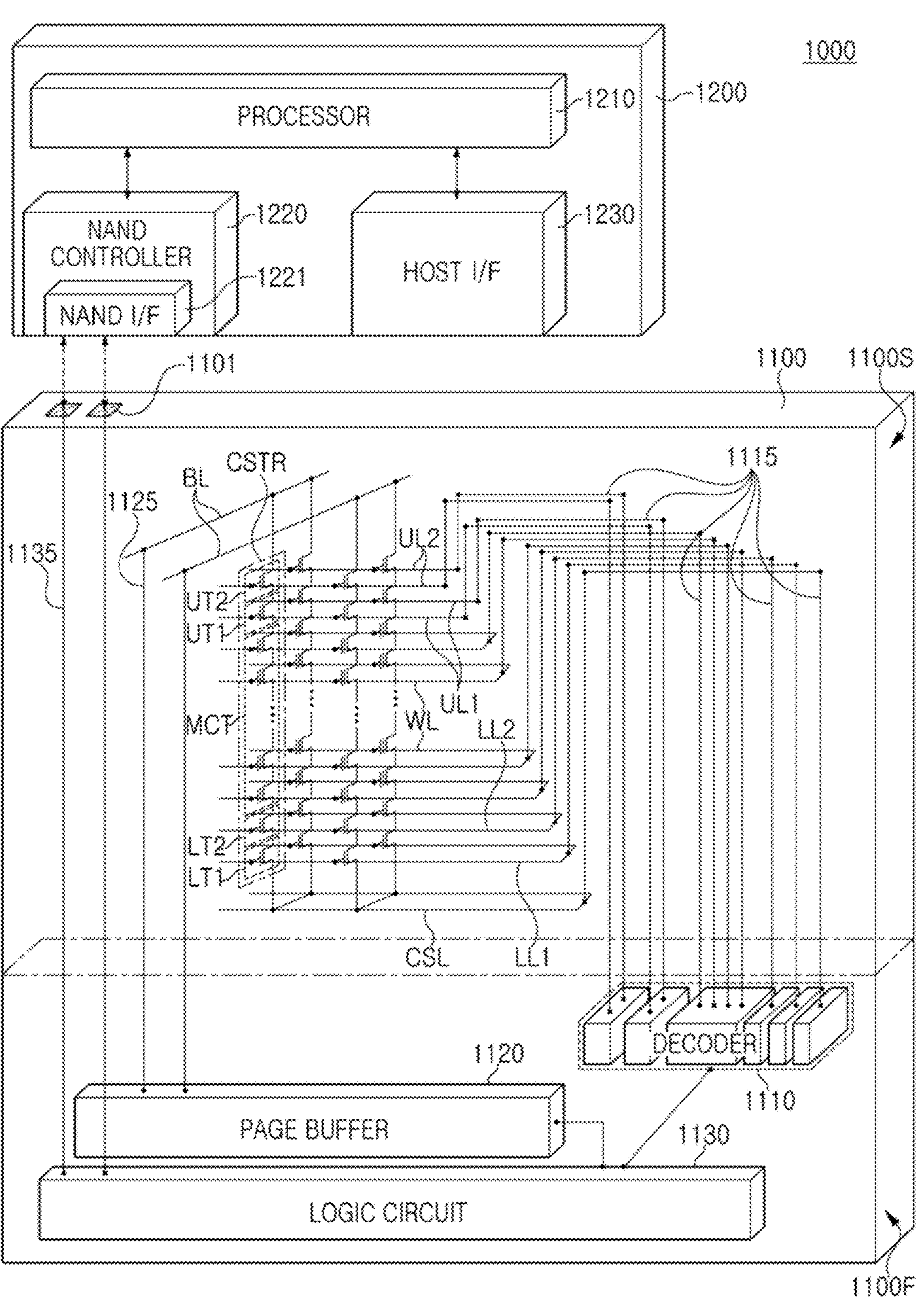
FIG. 18 is a view schematically illustrating a data storage system including a semiconductor device according to example embodiments.

FIG. 18 is a view schematically illustrating a data storage system including a semiconductor device according to example embodiments.

Referring to FIG. 18, a data storage system 1000 may include a semiconductor device 1100, and a controller 1200 electrically connected to the semiconductor device 1100. The data storage system 1000 may be a storage device including one or a plurality of semiconductor devices 1100, or an electronic device including the storage device. In an implementation, the data storage system 1000 may be a solid state drive device (SSD), a universal serial bus (USB), a computing system, a medical device, or a communication device, including the one or the plurality of semiconductor devices 1100.

The semiconductor device 1100 may be a non-volatile memory device, e.g., the NAND flash memory device described above with reference to FIGS. 1 to 6. The semiconductor device 1100 may include a first structure 1100F, and a second structure 1100S on the first structure 1100F. In an implementation, the first structure 1100F may be next to the second structure 1100S. The first structure 1100F may be a peripheral circuit structure including a decoder circuit 1110, a page buffer 1120, and a logic circuit 1130. The second structure 1100S may be a memory cell structure including bit lines BL, a common source line CSL, word lines WL, first and second upper gate lines UL1 and UL2, first and second lower gate lines LL1 and LL2, and memory cell strings CSTR between each of the bit lines BL and the common source line CSL.

In the second structure 1100S, each of the memory cell strings CSTR may include lower transistors LT1 and LT2 adjacent to the common source line CSL, upper transistors UT1 and UT2 adjacent to the bit lines BL, and a plurality of memory cell transistors MCT disposed between the lower transistors LT1 and LT2 and the upper transistors UT1 and UT2. The number of lower transistors LT1 and LT2 and the number of upper transistors UT1 and UT2 may be variously changed according to embodiments.

In an implementation, the upper transistors UT1 and UT2 may include a string select transistor, and the lower transistors LT1 and LT2 may include a ground select transistor. The lower gate lines LL1 and LL2 may be gate electrodes of the lower transistors LT1 and LT2, respectively. The word lines WL may be gate electrodes of the memory cell transistors MCT, and the upper gate lines UL1 and UL2 may be gate electrodes of the upper transistors UT1 and UT2, respectively.

In an implementation, the lower transistors LT1 and LT2 may include a lower erase control transistor LT1 and a ground select transistor LT2, connected in series. The upper transistors UT1 and UT2 may include a string select transistor UT1 and an upper erase control transistor UT2, connected in series. At least one of the lower erase control transistor LT1 or the upper erase control transistor UT2 may be used for an erase operation of erasing data stored in the memory cell transistors MCT using a gate-induced-drain-leakage (GIDL) phenomenon.

The common source line CSL, the first and second lower gate lines LL1 and LL2, the word lines WL, and the first and second upper gate lines UL1 and UL2 may be electrically connected to the decoder circuit 1110 through first connection wirings 1115 extending from the first structure 1100F into the second structure 1100S. The bit lines BL may be electrically connected to the page buffer 1120 through second connection wirings 1125 extending from the first structure 1100F into the second structure 1100S.

In the first structure 1100F, the decoder circuit 1110 and the page buffer 1120 may perform a control operation on at least one selected memory cell transistor among the plurality of memory cell transistors MCT. The decoder circuit 1110 and the page buffer 1120 may be controlled by the logic circuit 1130. The semiconductor device 1100 may communicate with the controller 1200 through an input/output pad 1101 electrically connected to the logic circuit 1130. The input/output pad 1101 may be electrically connected to the logic circuit 1130 through input/output connection wirings 1135 extending from the first structure 1100F into the second structure 1100S.

The controller 1200 may include a processor 1210, a NAND controller 1220, and a host interface 1230. In an implementation, the data storage system 1000 may include a plurality of semiconductor devices 1100, and in this case, the controller 1200 may control the plurality of semiconductor devices 1100.

The processor 1210 may control an overall operation of the data storage system 1000 including the controller 1200. The processor 1210 may operate according to a predetermined firmware, and may access to the semiconductor device 1100 by controlling the NAND controller 1220. The NAND controller 1220 may include a NAND interface 1221 processing communications with the semiconductor device 1100. A control command for controlling the semiconductor device 1100, data to be written to the memory cell transistors MCT of the semiconductor device 1100, data to be read from the memory cell transistors MCT of the semiconductor device 1100, or the like may be transmitted through the NAND interface 1221. The host interface 1230 may provide a communication function between the data storage system 1000 and an external host. When a control command is received from the external host through the host interface 1230, the processor 1210 may control the semiconductor device 1100 in response to the control command.

Figure 19:
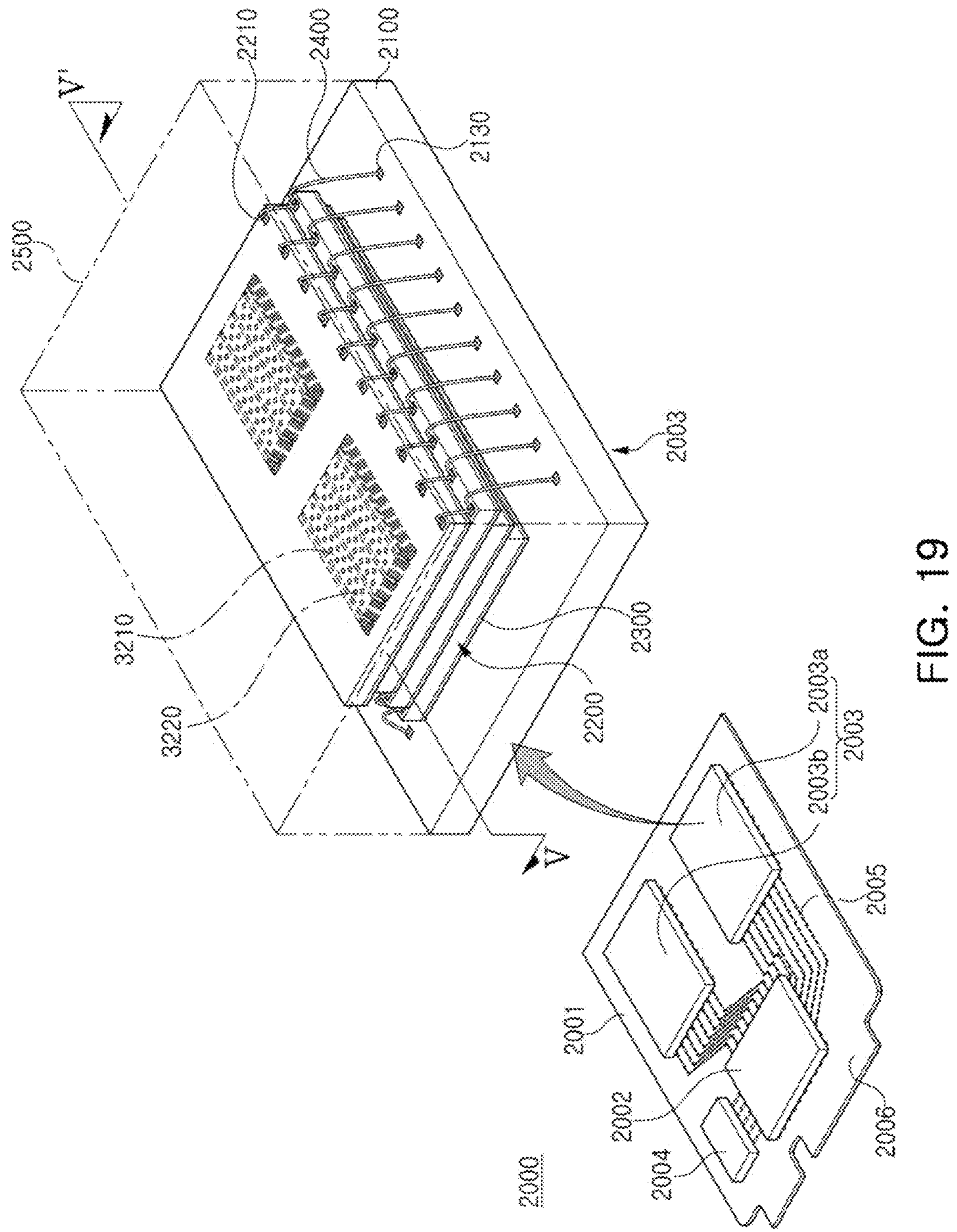
FIG. 19 is a perspective view schematically illustrating a data storage system including a semiconductor device according to an example embodiment.

FIG. 19 is a perspective view schematically illustrating a data storage system including a semiconductor device according to an example embodiment.

Referring to FIG. 19, a data storage system 2000 according to an example embodiment may include a main substrate 2001, a controller 2002 mounted on the main substrate 2001, at least one semiconductor package 2003, and a DRAM 2004. The semiconductor package 2003 and the DRAM 2004 may be connected to the controller 2002 by wiring patterns 2005 formed on the main substrate 2001.

The main substrate 2001 may include a connector 2006 including a plurality of pins, which may be coupled to an external host. The number and an arrangement of the plurality of pins in the connector 2006 may vary according to a communication interface between the data storage system 2000 and the external host. In example embodiments, the data storage system 2000 may be communicated with the external host according to any one interface of a universal serial bus (USB), peripheral component wiring express (PCI-Express), serial advanced technology attachment (SATA), M-Phy for universal flash storage (UFS), or the like. In an implementation, the data storage system 2000 may be operated by power supplied from the external host through the connector 2006. The data storage system 2000 may further include a power management integrated circuit (PMIC) distributing power, supplied from the external host, to the controller 2002 and the semiconductor package 2003.

The controller 2002 may write data to the semiconductor package 2003 or read data from the semiconductor package 2003, and may improve an operation speed of the data storage system 2000.

The DRAM 2004 may be a buffer memory reducing a difference in speed between the semiconductor package 2003, which may be a data storage space, and the external host. The DRAM 2004 included in the data storage system 2000 may also operate as a type of cache memory, and may provide a space temporarily storing data in a control operation on the semiconductor package 2003. When the DRAM 2004 is included in the data storage system 2000, the controller 2002 may further include a DRAM controller controlling the DRAM 2004 in addition to a NAND controller controlling the semiconductor package 2003.

The semiconductor package 2003 may include first and second semiconductor packages **2003*a* and 2003*b*, spaced apart from each other. Each of the first and second semiconductor packages 2003*a* and 2003*b* may be a semiconductor package including a plurality of semiconductor chips 2200. Each of the first and second semiconductor packages 2003*a* and 2003*b* may include a package substrate 2100, semiconductor chips 2200 on the package substrate 2100, adhesive layers 2300 on a lower surface of each of the semiconductor chips 2200, a connection structure 2400** electrically connecting each of the semiconductor chips 2200 and the package substrate 2100, and a molding layer 2500 covering the semiconductor chips 2200 and the connection structure 2400 on the package substrate 2100.

The package substrate 2100 may be a printed circuit board including package upper pads 2130. Each of the semiconductor chips 2200 may include an input/output pad 2210. The input/output pad 2210 may correspond to the input/output pad 1101 of FIG. 18. Each of the semiconductor chips 2200 may include gate stack structures 3210 and channel structures 3220. Each of the semiconductor chips 2200 may include the semiconductor device described above with reference to FIGS. 1 to 6.

In an implementation, the connection structure 2400 may be a bonding wire electrically connecting the input/output pad 2210 and the upper package pads 2130. Therefore, in each of the first and second semiconductor packages 2003*a* and 2003*b*, the semiconductor chips 2200 may be electrically connected to each other by a bonding wire process, and may be electrically connected to the package upper pads 2130 of the package substrate 2100. In an implementation, in each of the first and second semiconductor packages 2003*a* and 2003*b*, the semiconductor chips 2200 may be electrically connected to each other by a connection structure including a through silicon via (TSV), instead of a connection structure 2400 by a bonding wire process.

In an implementation, the controller 2002 and the semiconductor chips 2200 may be included in one (1) package. In an implementation, the controller 2002 and the semiconductor chips 2200 may be mounted on a separate interposer substrate, different from the main substrate 2001, and the controller 2002 and the semiconductor chips 2200 may be connected to each other by a wiring formed on the interposer substrate.

Figure 20:
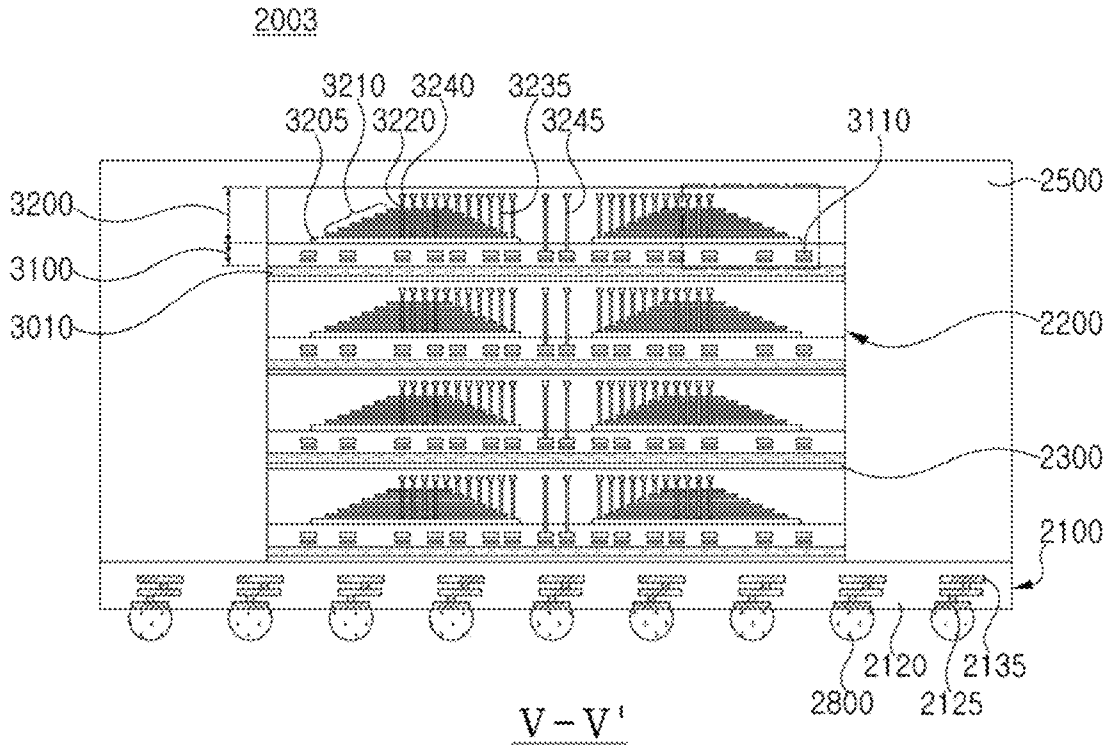
FIG. 20 is a cross-sectional view schematically illustrating a semiconductor package according to an example embodiment.

FIG. 20 is a cross-sectional view schematically illustrating a semiconductor package according to an example embodiment. FIG. 20 illustrates an example embodiment of the semiconductor package 2003 of FIG. 19, and conceptually illustrates a region taken along line V-V' of the semiconductor package 2003 of FIG. 19.

Referring to FIG. 20, in the semiconductor package 2003, the package substrate 2100 may be a printed circuit board. The package substrate 2100 may include a package substrate body portion 2120, package upper pads 2130 on an upper surface of the package substrate body portion 2120 (see FIG. 19), lower pads 2125 on a lower surface of the package substrate body portion 2120 or exposed from the lower surface, and internal wirings 2135 electrically connecting the upper pads 2130 and the lower pads 2125 in the package substrate body portion 2120. The upper pads 2130 may be electrically connected to the connection structures 2400. The lower pads 2125 may be connected to the wiring patterns 2005 of the main substrate 2001 of the data storage system 2000, as illustrated in FIG. 19, through conductive connection portions 2800.

Each of the semiconductor chips 2200 may include a semiconductor substrate 3010, and a first structure 3100 and a second structure 3200, sequentially stacked on the semiconductor substrate 3010. The first structure 3100 may include a peripheral circuit region including peripheral wirings 3110. The second structure 3200 may include a common source line 3205, a gate stack structure 3210 on the common source line 3205, channel structures 3220 passing through the gate stack structure 3210, bit lines 3240 electrically connected to the memory channel structures 3220, and gate contact plugs 3235 electrically connected to word lines WL (refer to FIG. 18) of the gate stack structure 3210. As described above with reference to FIGS. 1 to 6, each of the semiconductor chips 2200 may further include lower separation regions GC passing through lower gate electrodes 130L constituting a ground select transistor, and including first and second filling insulating layers 162 and 164.

Each of the semiconductor chips 2200 may include a through-wiring 3245 electrically connected to the peripheral wirings 3110 of the first structure 3100 and extending into the second structure 3200. The through-wiring 3245 may be outside the gate stack structure 3210, and may further pass through the gate stack structure 3210. Each of the semiconductor chips 2200 may further include an input/output pad 2210 (refer to FIG. 19) electrically connected to the peripheral wirings 3110 of the first structure 3100.

By way of summation and review, in a method for increasing data storage capacity of a semiconductor device, a semiconductor device may include memory cells arranged three-dimensionally, instead of memory cells arranged two-dimensionally.

A method of manufacturing a semiconductor device capable of manufacturing the semiconductor device having improved reliability may be provided by forming the first and second filling insulating layers dividing the gate electrode constituting the ground select transistor through a plurality of etching processes.

One or more embodiments may provide a semiconductor device having improved reliability.

One or more embodiments may provide a data storage system including a semiconductor device having improved reliability.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method for manufacturing a semiconductor device, the method comprising:

preparing a first semiconductor structure by forming circuit devices on a first substrate;

forming a second substrate, constituting a second semiconductor structure, on the first semiconductor structure;

forming a first stack region of a stack structure by alternately stacking first interlayer insulating layers and first sacrificial layers, extending in a first direction, on an upper surface of the second substrate;

forming a second stack region of the stack structure by alternately stacking second interlayer insulating layers and second sacrificial layers, extending in the first direction, on the first stack region;

forming first openings spaced apart from each other in the first direction by partially removing the second stack region;

forming a first filling insulating layer completely filling the first openings;

forming a second opening by partially removing the second stack region between the first openings in the first direction;

removing the second sacrificial layers exposed through the second opening;

forming a lower separation region including the first filling insulating layer and a second filling insulating layer, by forming the second filling insulating layer filling the second opening and regions between vertically-adjacent second interlayer insulating layers in which the second sacrificial layers have been removed;

forming a third stack region of the stack structure by alternately stacking third interlayer insulating layers and third sacrificial layers, extending in the first direction, on the first and second filling insulating layers;

forming channel structures passing through the stack structure;

forming third openings passing through the stack structure, extending in the first direction, and exposing a portion of the first and second filling insulating layers of the lower separation region;

removing the first to third sacrificial layers exposed through the third openings; and forming first to third gate electrodes by respectively filling a conductive material in regions in which the first to third sacrificial layers have been removed.

2. The method as claimed in claim 1, wherein removing the second sacrificial layers exposed through the second opening includes forming tunnel portions by removing the second sacrificial layers such that the first filling insulating layer is exposed through the tunnel portions.

3. The method as claimed in claim 1, wherein:

the second semiconductor structure includes a first region, and a second region at an end of the first region and in which the first to third sacrificial layers extend different lengths in the first direction, and the first and second openings are formed in the second region.

4. The method as claimed in claim 1, wherein the third openings pass through a portion of the lower separation region.

5. The method as claimed in claim 1, wherein the third openings are spaced apart from each other in the first direction with the lower separation region therebetween.

6. The method as claimed in claim 1, wherein the second opening passes through a center of the second stack region that remains between the first openings.

7. The method as claimed in claim 1, wherein the second opening passes through all of the second sacrificial layers of the second stack region and extends to a level that is higher than upper surfaces of the first sacrificial layers of the first stack region.

8. The method as claimed in claim 1, wherein the third sacrificial layers have substantially planar lower surfaces.

9. The method as claimed in claim 1, wherein the second filling insulating layer is formed by a deposition method that is different from a deposition method of the first filling insulating layer, and the second filling insulating layer is formed to completely fill the second opening and regions in which the second sacrificial layers have been removed.

10. The method as claimed in claim 1, wherein the first and second filling insulating layers include the same material.

11. The method as claimed in claim 1, wherein a width of the lower separation region in the first direction is in a range of about 500 nm to about 2,000 nm.

12. The method as claimed in claim 1, wherein two of the first sacrificial layers and two of the second sacrificial layers are stacked in a vertical direction perpendicular to the upper surface of the second substrate.

13. The method as claimed in claim 1, wherein at least one second gate electrode is a ground select transistor.

14. The method as claimed in claim 13, wherein the at least one second gate electrode comprises a plurality of second gate electrodes that are respectively separated by the third openings and the lower separation region.

15. The method as claimed in claim 13, wherein at least one first gate electrode forms an erase control transistor.

16. A method for manufacturing a semiconductor device, the method comprising:

forming a lower stack region of a stack structure by alternately stacking lower interlayer insulating layers and lower sacrificial layers, extending in a first direction, on an upper surface of a substrate;

forming first openings spaced apart from each other in the first direction by partially removing the lower stack region;

forming a first filling insulating layer completely filling the first openings;

forming a second opening by partially removing the lower stack region between the first openings;

removing portions of the lower sacrificial layers exposed through the second opening;

forming a second filling insulating layer filling the second opening and regions between vertically-adjacent lower interlayer insulating layers in which the lower sacrificial layers have been removed;

forming an upper stack region of the stack structure by alternately stacking upper interlayer insulating layers and upper sacrificial layers, extending in the first direction, on the first filling insulating layer and the second filling insulating layer;

forming third openings passing through the stack structure, extending in the first direction, and exposing a portion of the first filling insulating layer and the second filling insulating layer;

removing the upper sacrificial layers and the lower sacrificial layers through the third openings; and forming gate electrodes by filling a conductive material in regions from which the upper sacrificial layers and the lower sacrificial layers have been removed, wherein: the third openings are spaced apart from each other in the first direction, and the first filling insulating layer and the second filling insulating layer remain between the third openings.

17. The method as claimed in claim 16, wherein a first length of each of the first openings in the first direction is longer than a second length of the second opening in the first direction.

18. The method as claimed in claim 16, wherein entire widths of the first filling insulating layer and the second filling insulating layer in a second direction, perpendicular to the first direction, are wider than a width of each of the third openings in the second direction.

19. A method for manufacturing a semiconductor device, the method comprising:

forming a stack structure by alternately stacking interlayer insulating layers and sacrificial layers on an upper surface of a substrate;

forming first openings spaced apart from each other in a first direction by partially removing the stack structure at an upper surface of the stack structure to pass through at least one sacrificial layer among the sacrificial layers;

forming a first filling insulating layer completely filling the first openings;

forming a second opening by partially removing the stack structure at the upper surface of the stack structure between the first openings such that the second opening passes through the at least one sacrificial layer;

removing the at least one sacrificial layer exposed through the second opening; and forming a second filling insulating layer in the second opening and a region in which the at least one sacrificial layer has been removed such that the second filling insulating layer is vertically between vertically-adjacent interlayer insulating layers, wherein the at least one sacrificial layer is entirely removed from between the first openings.

20. The method as claimed in claim 19, wherein:

forming the second filling insulating layer includes forming the second filling insulating layer on an upper surface of the first filling insulating layer, and the method further comprises planarizing an upper surface of the second filling insulating layer, after forming the second filling insulating layer.

* * * * *